United States Patent
Yasusaka et al.

(10) Patent No.: US 10,613,563 B2
(45) Date of Patent: Apr. 7, 2020

(54) REGULATOR CIRCUIT INCLUDING ERROR AMPLIFIERS RESPECTIVELY CONTROLLING TRANSISTORS HAVING DIFFERENT SIZES ACCORDING TO STATE OF LOAD

(71) Applicant: ROHM CO., LTD., Kyoto-shi, Kyoto (JP)

(72) Inventors: Makoto Yasusaka, Kyoto (JP); Hiroki Inoue, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/130,291

(22) Filed: Sep. 13, 2018

(65) Prior Publication Data

US 2019/0079552 A1    Mar. 14, 2019

(30) Foreign Application Priority Data

Sep. 13, 2017  (JP) ................. 2017-175444
Sep. 13, 2017  (JP) ................. 2017-175445
Sep. 13, 2017  (JP) ................. 2017-175446
Sep. 7, 2018   (JP) ................. 2018-167461

(51) Int. Cl.
*G05F 1/575*    (2006.01)
*G05F 1/46*     (2006.01)
*G05F 3/26*     (2006.01)

(52) U.S. Cl.
CPC ............. *G05F 1/575* (2013.01); *G05F 1/461* (2013.01); *G05F 3/262* (2013.01)

(58) Field of Classification Search
CPC .. G05F 1/561–575; G05F 1/461; G05F 3/262; H03K 5/2472
See application file for complete search history.

(56) References Cited

U.S. PATENT DOCUMENTS

| | | | | |
|---|---|---|---|---|
| 4,672,566 A * | 6/1987 | Asano | ...................... | G01K 3/08 374/144 |
| 5,179,493 A * | 1/1993 | Imanishi | ................. | G05F 1/569 307/87 |
| 5,303,110 A * | 4/1994 | Kumagai | ................ | G05F 1/569 361/18 |
| 7,541,786 B2 * | 6/2009 | Yen | .......................... | G05F 1/46 323/275 |

(Continued)

FOREIGN PATENT DOCUMENTS

JP    2007011425 A    1/2007

*Primary Examiner* — Jeffrey A Gblende
*Assistant Examiner* — Peter M Novak
(74) *Attorney, Agent, or Firm* — Cantor Colburn LLP

(57) ABSTRACT

A regulator circuit supplies an output voltage $V_{OUT}$ to a load. A second transistor is arranged in parallel with a first transistor, and has a relatively small size. A feedback circuit generates a first feedback signal and a second feedback signal according to the output voltage $V_{OUT}$. A first error amplifier controls the first transistor such that the first feedback signal approaches a first reference value. A second error amplifier controls the second transistor such that the second feedback signal approaches a second reference value. In a light-load state, the operation of the first error amplifier is maintained.

9 Claims, 30 Drawing Sheets

(56) References Cited

U.S. PATENT DOCUMENTS

| | | | | |
|---|---|---|---|---|
| 7,821,240 B2* | 10/2010 | Oddoart | .............. | G05F 1/565 |
| | | | | 323/269 |
| 9,046,909 B2* | 6/2015 | Leibowitz | .............. | G05F 1/462 |
| 9,263,098 B2* | 2/2016 | Yoo | .............. | G11C 5/147 |
| 2012/0001606 A1* | 1/2012 | Chen | .............. | G11C 5/141 |
| | | | | 323/282 |

* cited by examiner

REGULATOR CIRCUIT INCLUDING ERROR AMPLIFIERS RESPECTIVELY CONTROLLING TRANSISTORS HAVING DIFFERENT SIZES ACCORDING TO STATE OF LOAD

BACKGROUND OF THE INVENTION

1. Field of the Invention

The present invention relates to a linear regulator.

2. Description of the Related Art

In various electronic circuits and electronic devices, a linear regulator is stabilizes a DC voltage having a given voltage value to a DC voltage having a different voltage value. FIG. 1 is a circuit diagram showing a linear regulator. A linear regulator 800 receives a DC voltage $V_{IN}$ via an input terminal 802, and generates and outputs, via an output terminal 804, an output voltage $V_{OUT}$ stabilized to a predetermined target voltage $V_{OUT(REF)}$. The linear regulator 800 mainly includes an output transistor 806, an error amplifier 808, and a feedback circuit 810.

The output transistor 806 is arranged between the input terminal 802 and the output terminal 804. The feedback circuit 810 divides the output voltage $V_{OUT}$, and generates a feedback voltage $V_{FB}$ that corresponds to the output voltage $V_{OUT}$. The error amplifier 808 amplifies the difference between the feedback voltage $V_{FB}$ and a predetermined reference voltage $V_{REF}$ in order to adjust the voltage applied to a control terminal (gate) of the output transistor 806. The output voltage $V_{OUT}$ is stabilized, by a feedback control operation, to the target voltage $V_{OUT(REF)}$ as represented by the following Expression.

$$V_{OUT}=V_{REF}\times(R_{11}+R_{12})/R_{12}$$

Depending on the application, in some cases, the output current $I_{OUT}$ of the linear regulator fluctuates over a very wide range. With the linear regulator 800 shown in FIG. 1, it is difficult to maintain stability over a wide load range. Specifically, this arrangement has a problem of a reduction of the phase margin and gain margin in a part of the load range (or otherwise the entire load range). In order to secure stability over the entire load range, this arrangement requires a tradeoff problem of reduced responsivity. This becomes a cause of degradation of transient characteristics.

In order to solve this problem, a technique has been proposed in which multiple linear regulators are coupled in parallel, and the linear regulator to be used is switched for each load range (Japanese Patent Application Laid Open No. 2007-11425, which will be referred to as "Patent document 1" hereafter).

With the technique described in Patent document 1, in order to reduce power consumption, an error amplifier for supporting a heavy load is completely turned off in a light-load state. FIG. 2 is a diagram for explaining a problem involved in such a conventional technique. There is a delay time before the operation of the error amplifier is restored from the off state. Accordingly, when a sudden change occurs in the load state from the light-load state to the heavy-load state, this leads to a large change in the output voltage $V_{OUT}$ due to the delay in the responsivity of the heavy-load-supporting error amplifier.

In some cases, the following steps are repeated, which has the potential to cause oscillation.

(i) Overshoot occurs in the output voltage $V_{OUT}$.
(ii) The heavy-load-supporting error amplifier turns off a heavy-load-side transistor in order to reduce the output voltage.
(iii) False judgment is made that the load state is the light load state.
(iv) The output voltage $V_{OUT}$ is lowered.
(v) The output voltage $V_{OUT}$ rises, and judgement is made that the load state is the heavy-load state, which turns on the heavy-load-supporting amplifier.

That is to say, the technique described in Patent document 1 does not necessarily ensure a stable operation over a wide load range.

SUMMARY OF THE INVENTION

The present invention has been made in order to solve such a problem. Accordingly, it is an exemplary purpose of an embodiment of the present invention to provide a regulator circuit that is capable of supporting stable operation over a wide load range.

1. An embodiment of the present invention relates to a regulator circuit structured to supply an output voltage to a load. The regulator circuit comprises: a first transistor; a second transistor arranged in parallel with the first transistor, and structured to have a relatively small size; a feedback circuit structured to generate a first feedback signal and a second feedback signal that correspond to the output voltage; a first error amplifier structured to control the first transistor such that the first feedback signal approaches a first reference value $V_{REF1}$; and a second error amplifier structured to control the second transistor such that the second feedback signal approaches a second reference value $V_{REF2}$. In a light-load state, the operation of the first error amplifier is maintained.

With this embodiment, in the light-load state, this arrangement allows the first error amplifier to turn off the first transistor while maintaining the operation state of the first error amplifier. This arrangement allows the first error amplifier to immediately turn on the first transistor even when the load state has suddenly changed from the light-load state to the heavy-load state, thereby suppressing fluctuation of the output voltage.

Also, a target voltage of the output voltage to be generated by a combination of the second transistor and the second error amplifier may be designed to be higher than a target voltage of the output voltage to be generated by a combination of the first transistor and the first error amplifier.

This allows the operation to be automatically and seamlessly switched between the light-load-state operation and the heavy-load-state operation.

With the feedback ratio of the first feedback signal as $\alpha_1$, and with the feedback ratio of the second feedback signal as $\alpha_2$, the relation $V_{REF1}/\alpha_1 < V_{REF2}/\alpha_2$ may hold true.

The second reference value $V_{REF2}$ may be higher than the first reference voltage $V_{REF1}$.

At least one from among the first error amplifier and the second error amplifier may have an input offset voltage.

In a case in which a common reference voltage is supplied to each of the first error amplifier and the second error amplifier, this arrangement is capable of substantially shifting at least one from among the first target value and the second target value.

The input offset voltage may be introduced by providing at least one from among the first error amplifier and the second error amplifier with a size difference between the differential input pair.

The regulator circuit according to an embodiment may further include: a reference voltage source structured to generate a reference voltage; and a level shift circuit structured to shift the reference voltage. From among the first reference value $V_{REF1}$ and the second reference value $V_{REF2}$, one before the level shift may be employed as one reference voltage, and the other after the level shift may be employed as the other reference voltage.

The second feedback signal may be smaller than the first feedback signal.

One from among the first feedback signal and the second feedback signal may be obtained by level shifting the other feedback signal.

The feedback ratio $\alpha_2$ of the second feedback signal may be lower than the feedback ratio $\alpha_1$ of the first feedback signal.

The regulator circuit according to an embodiment may further include: a judgment circuit structured to detect a light-load state; and a forced turn-off circuit structured to change the voltage at a control terminal of the first transistor to a voltage level at which the first transistor is substantially turned off.

The forced turn-off circuit may clamp the voltage across the control terminal of the first transistor and the input terminal of the regulator circuit such that it does not become smaller than a predetermined voltage.

2. An embodiment of the present invention relates to a regulator circuit structured to supply an output voltage to a load. The regulator circuit comprises: a first transistor; a second transistor arranged in parallel with the first transistor, and structured to have a relatively small size; a feedback circuit structured to generate a first feedback signal and a second feedback signal that correspond to the output voltage; a first error amplifier structured to control the first transistor such that the first feedback signal approaches a first reference value $V_{REF1}$; and a second error amplifier structured to control the second transistor such that the second feedback signal approaches a second reference value $V_{REF2}$. A target voltage of the output voltage to be generated by a combination of the second transistor and the second error amplifier is designed to be higher than a target voltage of the output voltage to be generated by a combination of the first transistor and the first error amplifier. When a load current is smaller than a predetermined threshold current, the first error amplifier is turned off.

This arrangement is capable of automatically and seamlessly switching the load state between a heavy-load state in which the first error amplifier EA1 operates effectively and a light-load state in which the second error amplifier EA2 operates effectively with a given current $I_{TH}$ as a boundary thereof.

Also, by suspending the operation of the first error amplifier in a range (which will be referred to as the "minimum-load state") in which the load current $I_{OUT}$ is smaller than a threshold current $I_{MIN}$ that is defined to be lower than the current $I_{TH}$ that defines the boundary, this arrangement allows current consumption to be reduced in the overall circuit in the minimum-load state while supporting the automatic load state switching.

The "off state of the first error amplifier" includes a case in which a part of the operation thereof is completely suspended, and a case in which the first error amplifier is set to a standby state with reduced capability, in addition to the operation of the first error amplifier is completely suspended. That is to say, the off state of the first error amplifier can be regarded as a state in which the operation current is smaller than that of the normal on state.

Also, the regulator circuit may further comprise a monitoring circuit structured to compare the load current with the threshold current.

Also, the monitoring circuit may be structured to convert a current that flows through the second transistor into a detection voltage, and to compare the detection voltage with a threshold voltage that corresponds to the threshold current. By using the current that flows through the second transistor, this arrangement is capable of judging whether or not the load state is the minimum-load state.

Also, the monitoring circuit may comprise: a third transistor arranged such that a control terminal thereof is coupled in common with a control terminal of the second transistor; and a sensing resistor arranged in series with the third transistor. Also, the voltage drop across the sensing resistor may be employed as the detection voltage.

Also, the regulator circuit may further comprise a fourth transistor arranged such that the detection voltage is applied across a gate and source thereof. Also, the first error amplifier may be controlled according to an on/off operation of the fourth transistor.

Also, the on/off operation of the first error amplifier may be controlled by a bias current supplied to the first error amplifier.

Also, the regulator circuit may further comprise a sub current source structured to supply a non-zero, very small bias current to the first error amplifier. By supplying a minimum necessary current to the first error amplifier in the minimum-load state, this arrangement provides improved responsivity with respect to a sudden change in the load state from the minimum-load state to the heavy-load state.

3. An embodiment of the present invention relates to a regulator circuit structured to supply an output voltage to a load. The regulator circuit comprises: a first linear regulator; and a second linear regulator arranged such that an input and an output thereof are respectively coupled in common with an input and an output of the first linear regulator, and structured to have a relatively small current capacity. The difference between a target voltage of the second linear regulator and a target voltage of the first linear regulator is changed according to a state of the load.

In this embodiment, a difference is provided between the first linear regulator and the second linear regulator. Accordingly, in the light-load state, this arrangement is capable of substantially turning off the first linear regulator and of operating the second linear regulator, and in the heavy-load state, this arrangement is capable of operating both the first linear regulator and the second linear regulator. Also, by adjusting the target voltage such that the output transistor of the second linear regulator is not fully turned on in the heavy-load state, this arrangement provides an improved power supply rejection ratio.

Also, in a light-load state, the target voltage of the second linear regulator may be higher than the target voltage of the first linear regulator. Also, in a heavy-load state, the target voltage of the second linear regulator may be adjusted such that it approaches the target voltage of the first linear regulator.

Also, the target voltage of the second linear regulator may be continuously changed according to a load current.

Also, the target voltage of the second linear regulator may be changed in a discrete manner according to a load current.

Also, the first linear regulator may comprise: a first transistor; and a first error amplifier structured to control the first transistor such that a first feedback signal $V_{FB1}$ that corresponds to the output voltage approaches a first reference value $V_{REF1}$. Also, the second linear regulator may comprise: a second transistor arranged in parallel with the first transistor, and structured to have a relatively small size; and a second error amplifier structured to control the second transistor such that a second feedback signal $V_{FB2}$ that corresponds to the output voltage approaches a second reference value $V_{REF2}$.

Also, $V_{FB1}=V_{FB2}$ may hold true. Also, the regulator circuit may further comprise an offset control unit structured to change a difference between the first reference value $V_{REF1}$ and the second reference value $V_{REF2}$ according to a load current.

Also, $V_{REF1}=V_{REF2}$ may hold true. Also, the regulator circuit may further comprise an offset control unit structured to change a difference between the first feedback signal $V_{FB1}$ and the second feedback signal $V_{FB2}$ according to a load current.

Also, $V_{REF1}<V_{REF2}$ may hold true. Also, the regulator circuit may further comprise an offset control unit structured to change a difference between the first feedback signal $V_{FB1}$ and the second feedback signal $V_{FB2}$ according to a load current.

Also, $V_{FB1}>V_{FB2}$ may hold true. Also, the regulator circuit may further comprise an offset control unit structured to change a difference between the first reference value $V_{REF1}$ and the second reference value $V_{REF2}$ according to a load current.

Also, the regulator circuit may monolithically be integrated on a single semiconductor substrate. Examples of such an "integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By integrating the circuit on a single chip, such an arrangement allows the circuit area to be reduced, and allows the circuit elements to have uniform characteristics.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

Figure 1:
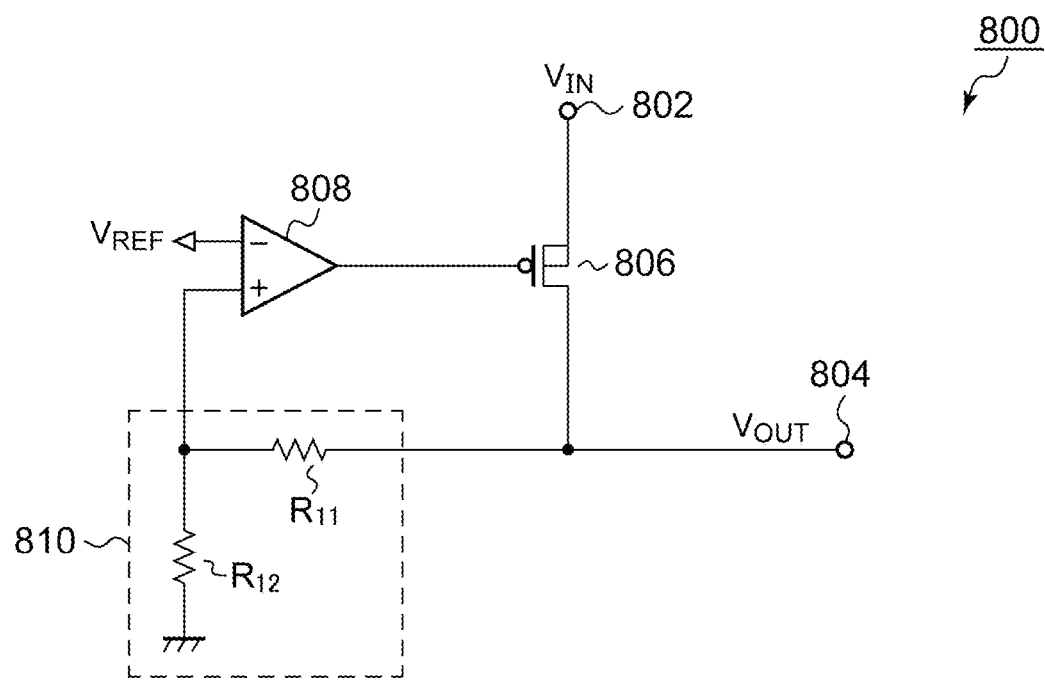
FIG. 1 is a circuit diagram showing a regulator circuit.

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not substantially affect the electric connection between them, or that does not damage the functions of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions of the connection between them, in addition to a state in which they are directly coupled.

Also, the phrase "a signal A (voltage or current) corresponds to a signal B (voltage or current)" means the state in which the signal A has a correlation with the signal B. Specific examples of such a state include: (i) a state in which the signal A is the same as the signal B; (ii) a state in which the signal A is proportional to the signal B; (iii) a state in which the signal A is obtained by shifting the level of the signal B; (iv) a state in which the signal A is obtained by amplifying the signal B; (v) a state in which the signal A is obtained by inverting the signal B; (vi) a desired combination of the aforementioned states (i) through (v); and the like. The range of "corresponds" as described above is determined by the kinds of the signals A and B and the usage of the signals A and B, which can clearly be understood by those skilled in this art.

The vertical axis and the horizontal axis shown in the waveform diagrams and the time charts in the present specification are expanded or reduced as appropriate for ease of understanding. Also, each waveform shown in the drawing is simplified or exaggerated for emphasis or ease of understanding.

First Embodiment

Figure 3:
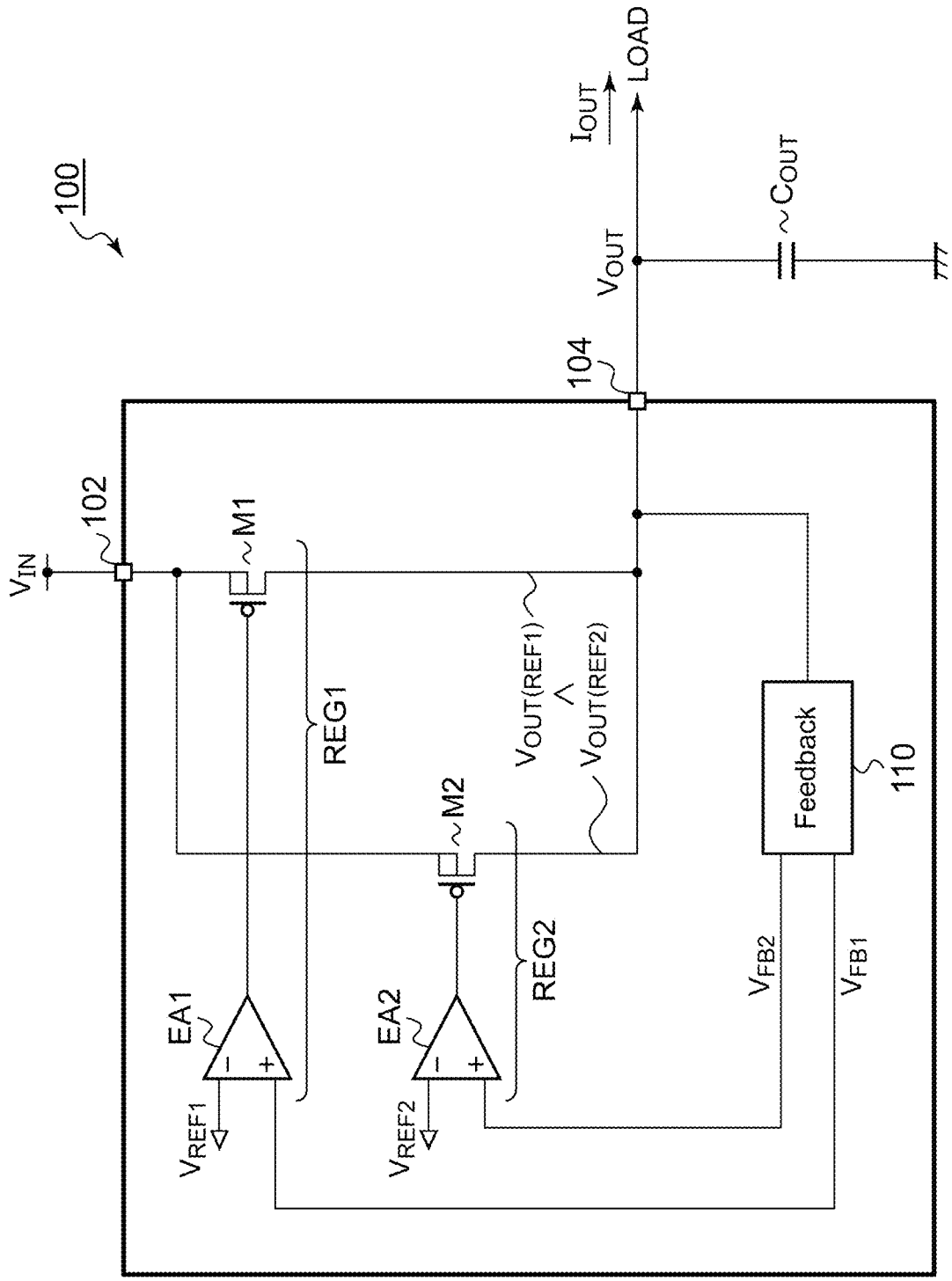
FIG. 3 is a circuit diagram showing a regulator circuit according to a first embodiment.

FIG. 3 is a circuit diagram showing a regulator circuit 100 according to a first embodiment. The regulator circuit 100 receives an input voltage $V_{IN}$ via its input terminal 102, and supplies an output voltage $V_{OUT}$ stabilized to a given target voltage $V_{OUT}(REF)$ to a load (not shown) coupled to an output terminal 104 thereof. The regulator circuit 100 is also referred to as an LDO (Low Drop Output) circuit. An output capacitor $C_{OUT}$ is coupled to the output terminal 104 for smoothing the output voltage $V_{OUT}$. The components of the regulator circuit 100 may be monolithically integrated on a single semiconductor substrate except for the output capacitor $C_{OUT}$.

The regulator circuit 100 includes a first transistor M1, a second transistor M2, a first error amplifier EA1, and a second error amplifier EA2. The first transistor M1 and the first error amplifier EA1 form a first linear regulator (heavy-load-supporting regulator) REG1 that is capable of supplying electric power to the load mainly in a heavy-load state. The second transistor M2 and the second error amplifier EA2 form a second linear regulator (light-load-supporting regulator) REG2 that is capable of supplying electric power to the load mainly in a light-load state. The second transistor M2 has an element size that is relatively smaller than that of the first transistor M1.

More specifically, the first transistor M1 and the second transistor M2 are arranged in parallel between the input terminal 102 and the output terminal 104. In the present embodiment, the first transistor M1 and the second transistor M2 are each configured as a P-channel MOSFET. Also, the first transistor M1 and the second transistor M2 may each be configured as a PNP bipolar transistor.

A feedback circuit 110 generates a first feedback signal $V_{FB1}$ and a second feedback signal $V_{FB2}$ that correspond to the output voltage $V_{OUT}$. Typically, the feedback circuit 110 is configured as a resistor voltage dividing circuit. However, in a case in which the regulator circuit 100 is configured as buffer (voltage follower circuit), the feedback circuit 110 may be configured as a simple wiring circuit.

The first error amplifier EA1 controls a voltage (gate voltage) applied to a control terminal (gate) of the first transistor M1 such that the first feedback signal $V_{FB1}$ approaches a first reference voltage $V_{REF1}$. Furthermore, the second error amplifier EA2 controls a gate voltage of the second transistor M2 such that the second feedback signal $V_{FB2}$ approaches a second reference voltage $V_{REF2}$.

The target voltage $V_{OUT(REF2)}$ of the output voltage $V_{OUT}$ to be generated by the light-load-supporting linear regulator REG2 configured as a combination of the second transistor M2 and the second amplifier EA2 is set to a value that is slightly higher than the target voltage $V_{OUT(REF1)}$ of the output voltage $V_{OUT}$ to be generated by the heavy-load-supporting linear regulator REG1 configured as a combination of the first transistor M1 and the first error amplifier EA1.

$$V_{OUT(REF2)} > V_{OUT(REF1)}$$

As an example, in an application with $V_{OUT}$=5V, the target voltage $V_{OUT(REF2)}$ is set to a voltage value that is several dozen mV to several hundred mV higher than the target voltage $V_{OUT(REF1)}$.

Figure 4:
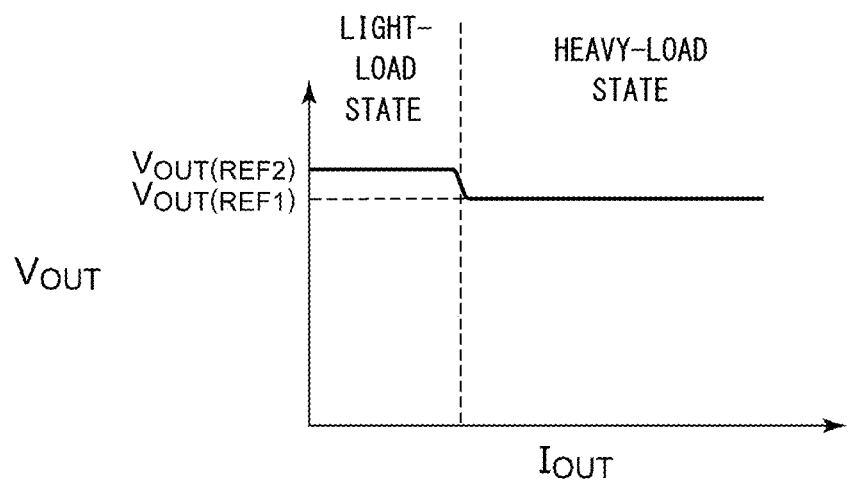
FIG. 4 is a diagram showing an operation state of the regulator circuit shown in FIG. 3.

The above is the configuration of the regulator circuit 100. Next, description will be made regarding the operation thereof. FIG. 4 is a diagram showing an operation state of the regulator circuit 100 shown in FIG. 3. The horizontal axis represents the load current $I_{OUT}$, and the vertical axis represents the output voltage $V_{OUT}$. The boundary between the heavy-load state and the light-load state is indicated by the dashed line.

A combination of the first transistor M1 and the first error amplifier EA1 has a larger capacity. Accordingly, in the heavy-load state, the output voltage $V_{OUT}$ is stabilized to the first target voltage $V_{OUT(REF1)}$.

In the light-load state, the output voltage $V_{OUT}$ is stabilized to the second target voltage $V_{OUT(REF2)}$ by means of the second transistor M2 and the second error amplifier EA2. Even in the light-load state, the operation state of the first error amplifier EA1 is maintained. The first error amplifier EA1 generates a gate voltage $V_G$ in order to set the first transistor M1 to the off state.

When the load state transits from the light-load state to the heavy-load state, the load current $I_{OUT}$ exceeds the current supply capacity of the second transistor M2. Accordingly, the output voltage $V_{OUT}$ drops, and the first error amplifier EA1 and the first transistor M1 are automatically activated. In this state, the output voltage $V_{OUT}$ is stabilized to the first target voltage $V_{OUT(REF1)}$.

The above is the operation of the regulator circuit 100. Next, description will be made regarding the advantages thereof.

With the regulator circuit 100, by employing the light-load-supporting regulator and the heavy-load-supporting regulator in parallel, this arrangement provides an optimized phase margin and gain margin over a wide load range.

Furthermore, this arrangement is capable of automatically and seamlessly switching the regulator to be used between the heavy-load-supporting regulator REG1 and the lightload-supporting regulator REG2 according to transition between the light-load state and the heavy-load state. That is to say, this arrangement does not require a circuit configuration comparing the load current $I_{OUT}$ with a threshold value and to switch the regulator to be used between the two regulators, i.e., the regulators REG1 and REG2, according to a comparison result, which is an advantage.

In a case in which the regulator to be used is selectively switched between two regulators based on the comparison result, if the load current $I_{OUT}$ fluctuates at the boundary between the heavy-load state and the light-load state, the regulators REG1 and REG2 each repeat their on/off operations, leading to degraded circuit stability. In contrast, with the present embodiment, the regulator to be used is seamlessly switched between the regulators REG1 and REG2, thereby providing improved circuit stability.

Furthermore, the operation of the first error amplifier EA1 is maintained even in the light-load state. Accordingly, this arrangement is capable of immediately turning on the first transistor M1 even if the load current $I_{OUT}$ suddenly rises. This arrangement is capable of preventing the output voltage $V_{OUT}$ from further falling beyond $V_{OUT(REF1)}$.

Figure 2:
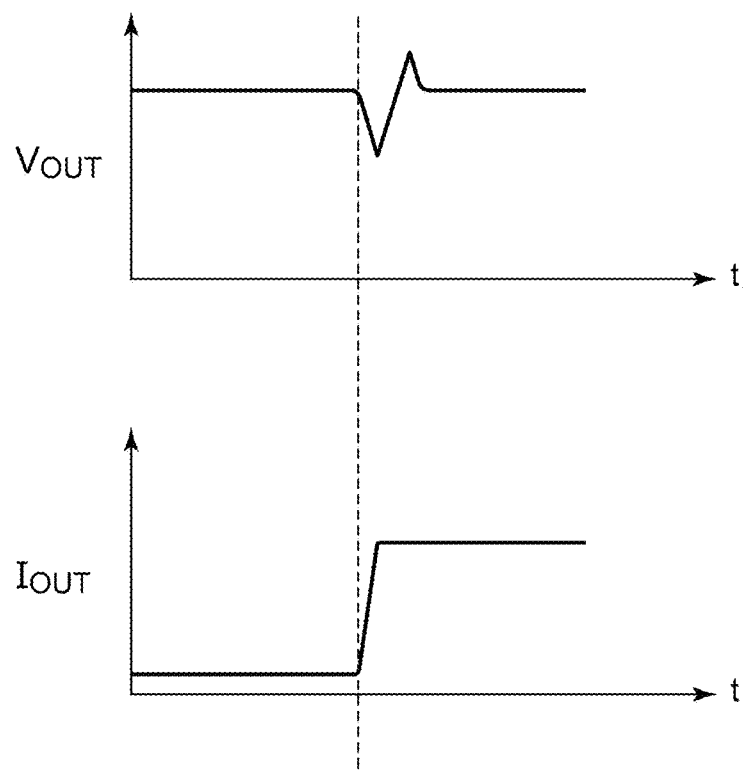
FIG. 2 is a diagram for explaining a problem of a conventional technique.

The present invention encompasses various apparatuses and circuits that can be regarded as a block configuration or a circuit configuration shown in FIG. 2, or otherwise that can be derived from the aforementioned description. That is to say, the present invention is not restricted to a specific configuration. More specific description will be made below regarding example configurations and modifications for clarification and ease of understanding of the essence of the present invention and the circuit operation. That is to say, the following description will by no means be intended to restrict the technical scope of the present invention.

Description will be made regarding several examples of a configuration that supports the relation $V_{OUT(REF1)} < V_{OUT(REF2)}$.

Example 1.1

Figure 5:
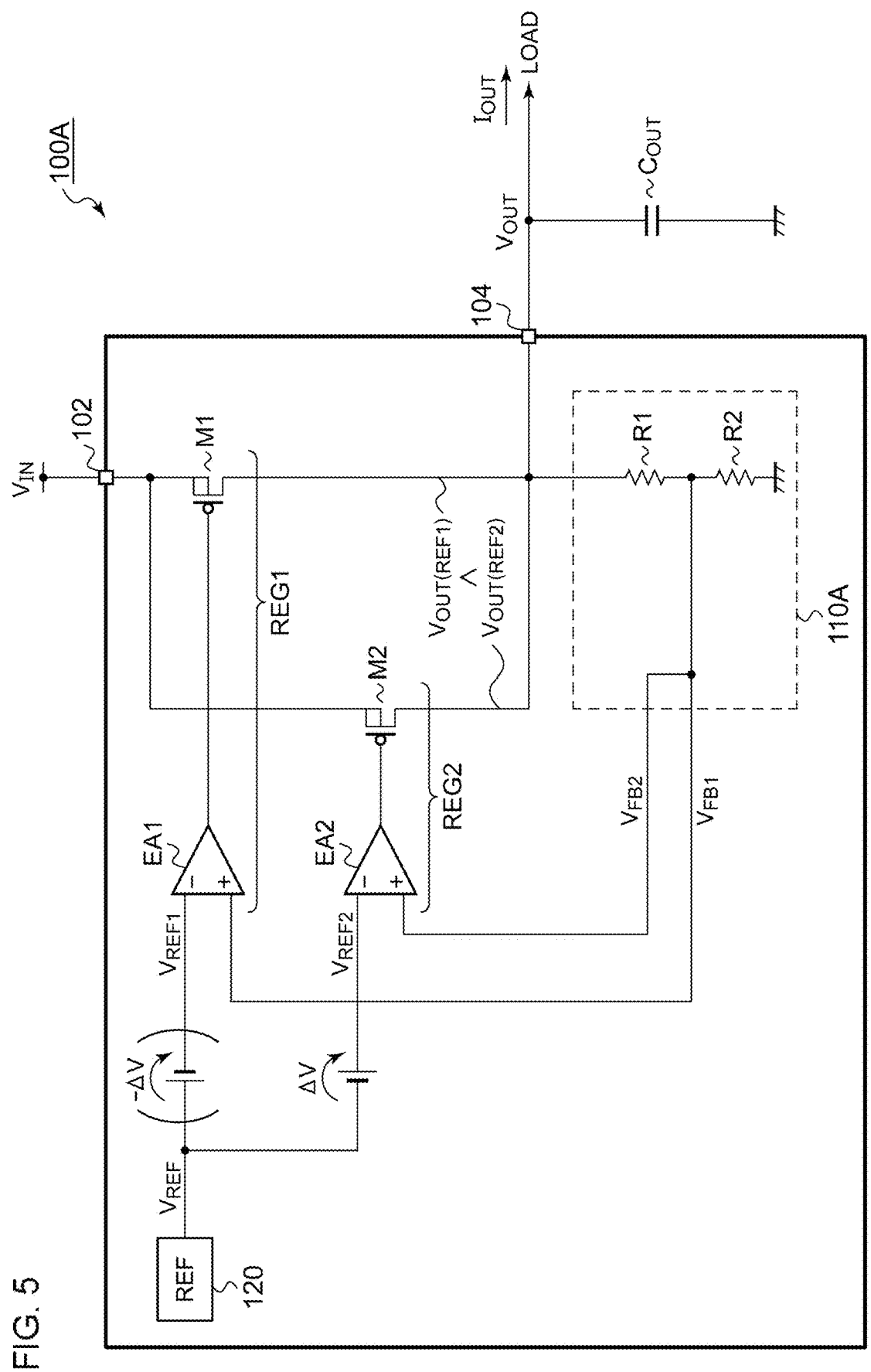
FIG. 5 is a circuit diagram showing a regulator circuit according to an example 1.1.

FIG. 5 is a circuit diagram showing a regulator circuit 100A according to an example. With this example, the relations $V_{FB1} = V_{FB2}$, and $V_{REF1} > V_{REF2}$ hold true. A feedback circuit 110A includes resistors R1 and R2. The feedback ratio $\alpha_1$ of the first feedback signal $V_{FB1}$ is equal to the feedback ratio $\alpha_2$ of the second feedback signal $V_{FB2}$, which is represented by $\alpha = R2/(R1+R2)$.

$$V_{FB1} = V_{FB2} = V_{OUT} \times \alpha$$

The reference value $V_{REF2}$ employed by the second error amplifier EA2 is higher than the reference value $V_{REF1}$ employed by the first error amplifier EA1. A reference voltage source 120 generates a predetermined reference voltage $V_{REF}$. The reference voltage $V_{REF}$ is supplied without change to the first error amplifier EA1, which is used as the first reference value $V_{REF1}$. Furthermore, a positive offset voltage $\Delta V$ is added to the reference voltage $V_{REF}$ in order to generate the second reference voltage $V_{REF2}$.

Alternatively, the reference voltage $V_{REF}$ may be used as the second reference voltage $V_{REF2}$. Furthermore, a negative offset voltage $\Delta V$ is added to the reference voltage $V_{REF}$ in order to generate the first reference voltage $V_{REF1}$.

Figure 6A:
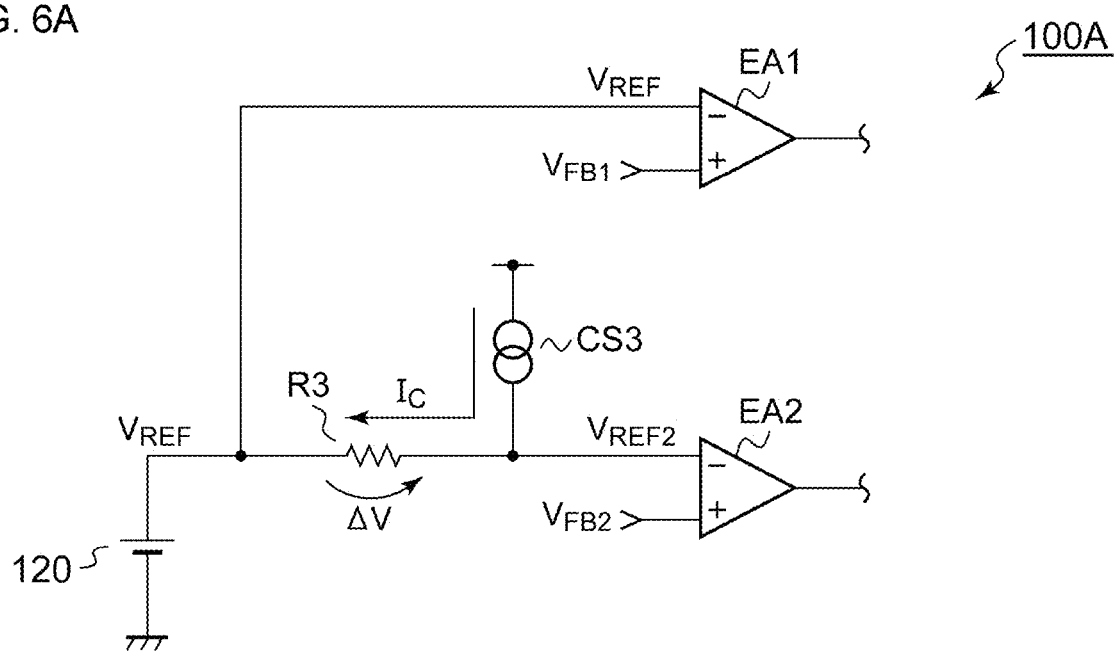
FIG. 6A and FIG. 6B are circuit diagrams each showing a configuration for generating two offset reference values $V_{REF1}$ and $V_{REF2}$.
Figure 6B:
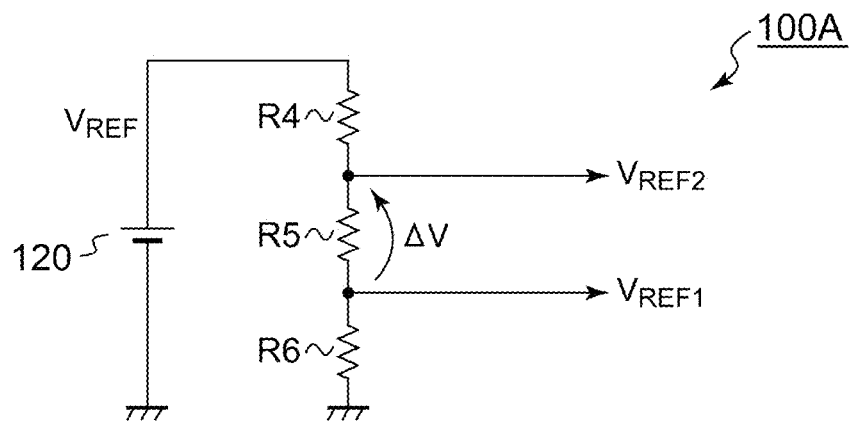

FIGS. 6A and 6B are circuit diagrams each showing a configuration for generating two offset reference values $V_{REF1}$ and $V_{REF2}$. A regulator circuit 100A shown in FIG. 6A includes a resistor R3 and a current source CS3. A reference voltage $V_{REF}$ generated by the reference voltage source 120 is applied to one end of the resistor R3. The other end of the resistor R3 is coupled to an input of the error amplifier EA2. Furthermore, the other end of the resistor R3 is coupled to the current source CS3. The current Ic generated by the current source CS3 is supplied such that it flows through the resistor R3, which generates a voltage drop that corresponds to the offset voltage $\Delta V$.

The regulator circuit 100A shown in FIG. 6B includes resistors R4 through R6. The resistors R4 through R6 are coupled in series. The target voltages $V_{REF1}$ and $V_{REF2}$ are drawn from the two respective taps. The voltage drop that occurs across the resistor R5 corresponds to the offset voltage $\Delta V$. The resistor R4 may be omitted.

Example 1.2

Figure 7:
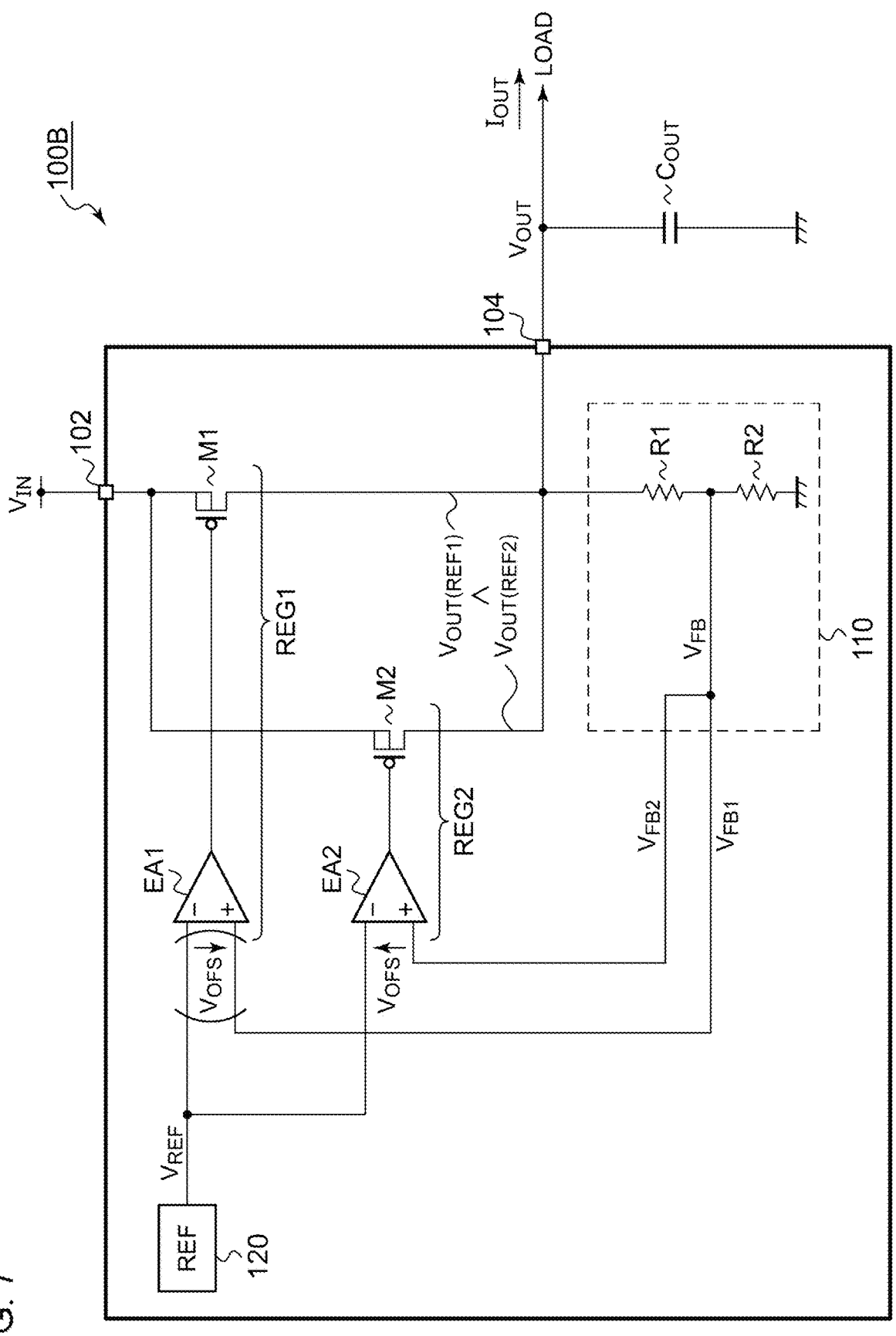
FIG. 7 is a circuit diagram showing a regulator according to an example 1.2.

FIG. 7 is a circuit diagram showing a regulator circuit 100B according to an example. With the regulator circuit 100B, a designed reference value $V_{OFS}$ is applied to the second error amplifier EA2. By applying such an input offset voltage $V_{OFS2}$, an effective reference value $V_{REF2}$ is shifted. From another viewpoint, by applying such an input offset voltage $V_{OFS2}$, it can be understood that the effective second feedback signal $V_{FB2}$ is shifted.

The first error amplifier EA1 adjusts the gate voltage of the first transistor M1 such that the relation $V_{REF} = V_{FB}$ holds true. On the other hand, the second error amplifier EA2 adjusts the gate voltage of the second transistor M2 such that the relation $V_{REF} + V_{OFS2} = V_{FB}$ holds true.

Accordingly, the following relations hold true.

$$V_{OUT(REF1)} = V_{REF} \times (R1+R2)/R2$$

$$V_{OUT(REF2)} = (V_{REF} + V_{OFS2}) \times (R1+R2)/R2$$

Thus, the following relation holds true.

$$V_{OUT(REF2)} > V_{OUT(REF1)}$$

Instead of or in addition to applying the input offset voltage $V_{OFS2}$ to the second error amplifier EA2, an input offset voltage $V_{OFS1}$ may be supplied to the first error amplifier EA1. In this case, the polarity of the offset voltage $V_{OFS1}$ is the reverse of that of the offset voltage $V_{OFS2}$.

Figure 8A:
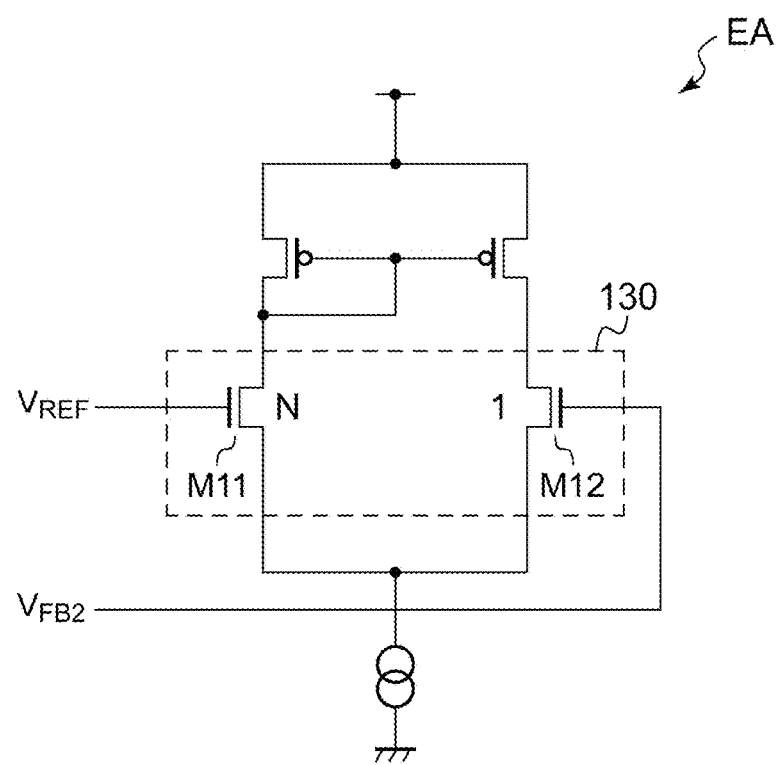
FIG. 8A and FIG. 8B are circuit diagrams each showing an example configuration of a second error amplifier employing an input offset voltage.
Figure 8B:
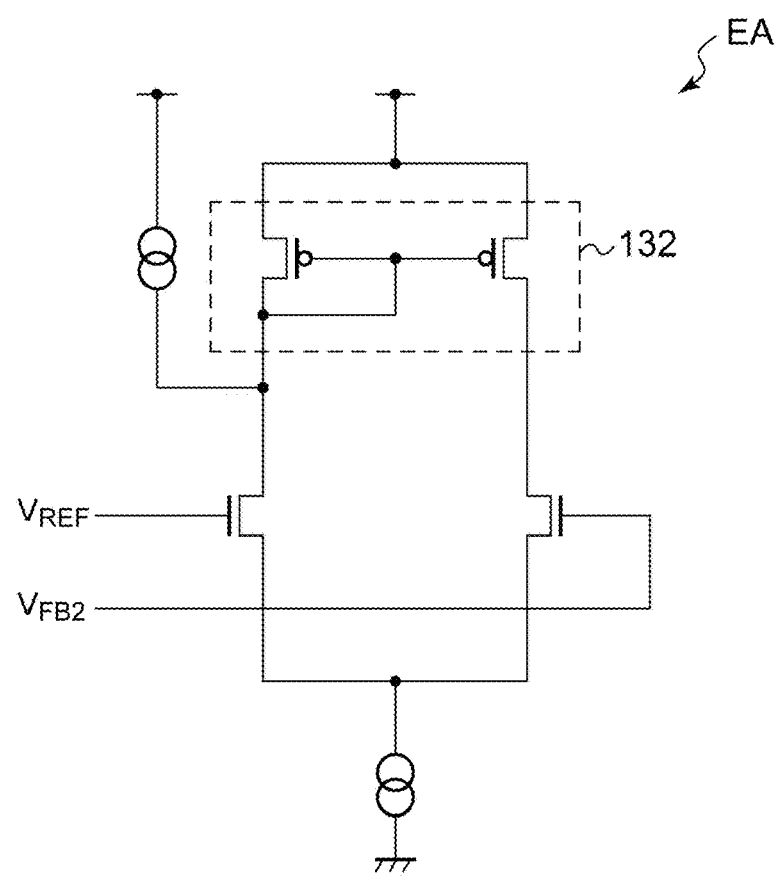

FIG. 8A and FIG. 8B are circuit diagrams each showing an example configuration of the second error amplifier EA2 employing the input offset voltage $V_{OFS2}$. FIG. 8A and FIG. 8B each show only a differential amplifier configured as a primary stage of the error amplifier. In the second error amplifier EA2 shown in FIG. 8A, two transistors M11 and M12 that form a differential input pair 130 have a size ratio of N:1. That is to say, this arrangement provides a difference between the two transistors M11 and M12.

In the error amplifier EA shown in FIG. 8B, a current source 134 is coupled to a current mirror load 132. The current generated by the current source 134 provides an unbalanced state, which provides the input offset voltage $V_{OFS2}$.

The configuration for providing the input offset voltage $V_{OFS}$ is not restricted to such arrangements. It can also be understood that the circuit configuration shown in FIG. 6A provides the input offset voltage $V_{OFS}$.

Example 1.3

Figure 9:
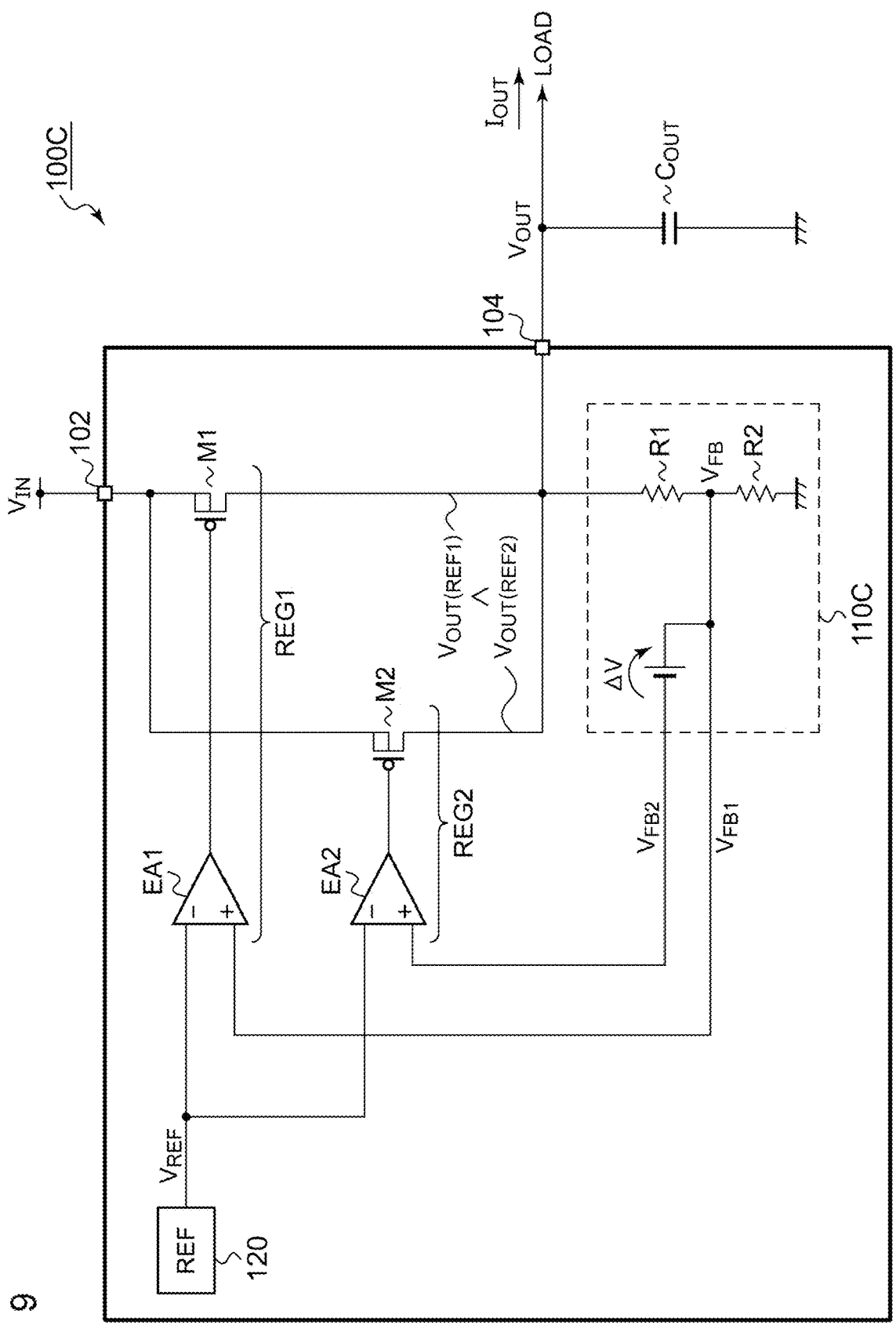
FIG. 9 is a circuit diagram showing a regulator circuit according to an example 1.3.

FIG. 9 is a circuit diagram showing a regulator circuit 100C according to an example. With this example, the relations $V_{FB1} < V_{FB2}$, and $V_{REF1} = V_{REF2}$ hold true. That is to say, with the feedback circuit 110C, the relation $V_{FB1} < V_{FB2}$ can be provided by introducing the offset voltage $\Delta V$.

Figure 10A:
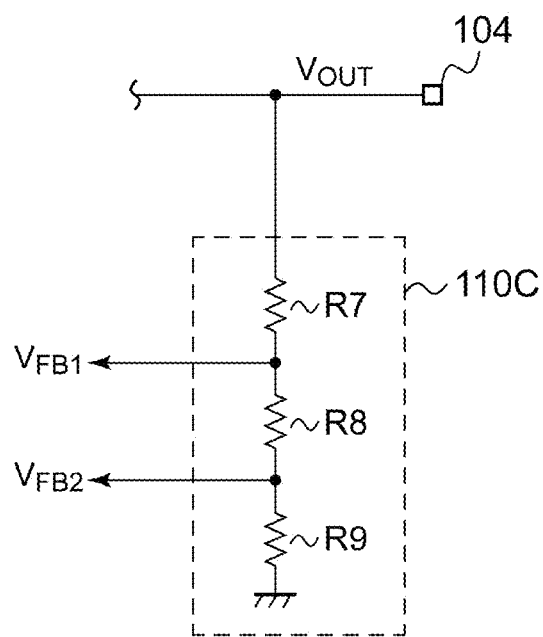
FIG. 10A and FIG. 10B are circuit diagrams each showing an example configuration of a feedback circuit.
Figure 10B:
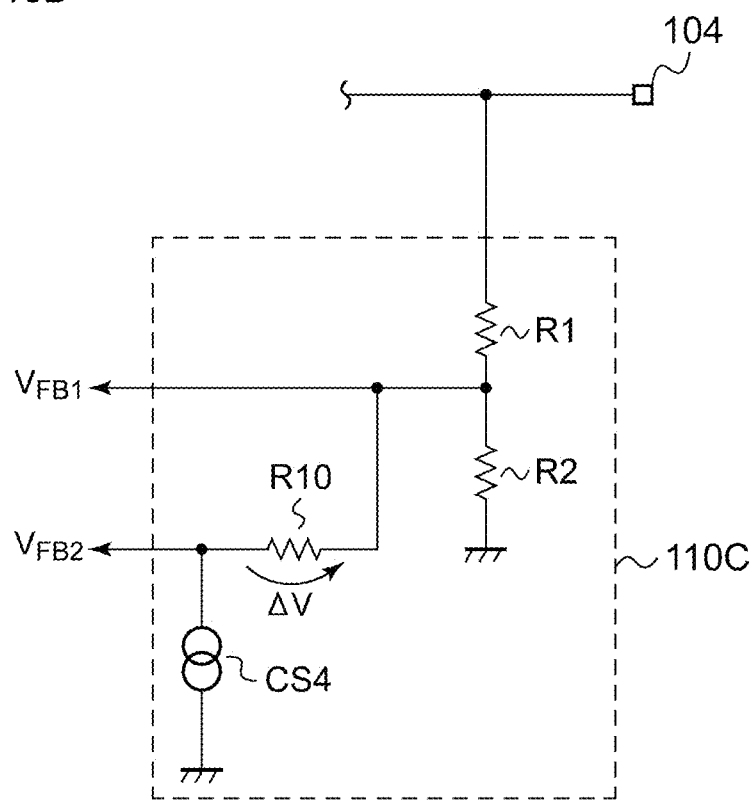

FIG. 10A and FIG. 10B are circuit diagrams each showing an example configuration of the feedback circuit 110C. The feedback circuit 110C shown in FIG. 10A includes three resistors R7 through R9 coupled in series. The feedback signals $V_{FB1}$ and $V_{FB2}$ are drawn from the two respective taps. The voltage drop that occurs across the resistor R8 corresponds to the offset voltage $\Delta V$. The offset voltage $\Delta V$ is proportional to the output voltage $V_{OUT}$.

From another viewpoint, it can also be understood that the feedback circuit 110C shown in FIG. 10A employs the feedback signals $V_{FB1}$ and $V_{FB2}$ with different feedback ratios.

$$\alpha_1 = (R8+R9)/(R7+R8+R9)$$

$$\alpha_2 = R9/(R7+R8+R9)$$

That is to say, the relation $\alpha_2 < \alpha_1$ holds true.

The feedback circuit 110C shown in FIG. 10B has a configuration including a resistor R10 and a current source CS4. By supplying a current generated by the current source CS4 such that it flows through the resistor R10, a voltage drop occurs across the resistor R10. This voltage drop is employed as the offset voltage. It should be noted that, with the feedback circuit 110C, the first feedback signal $V_{FB1}$ is shifted due to the current generated by the current source CS4. Accordingly, the resistance values R1 and R2 and the current amount may preferably be designed giving consideration to the shift amount. In a case in which a regulator circuit 200 employs a voltage follower configuration, the resistors R1 and R2 are omitted, and the voltage $V_{OUT}$ at the output terminal 104 is employed as the first feedback signal $V_{FB1}$. Accordingly, the feedback signal $V_{FB1}$ is not affected by the current generated by the current source CS4.

Second Embodiment

Figure 11:
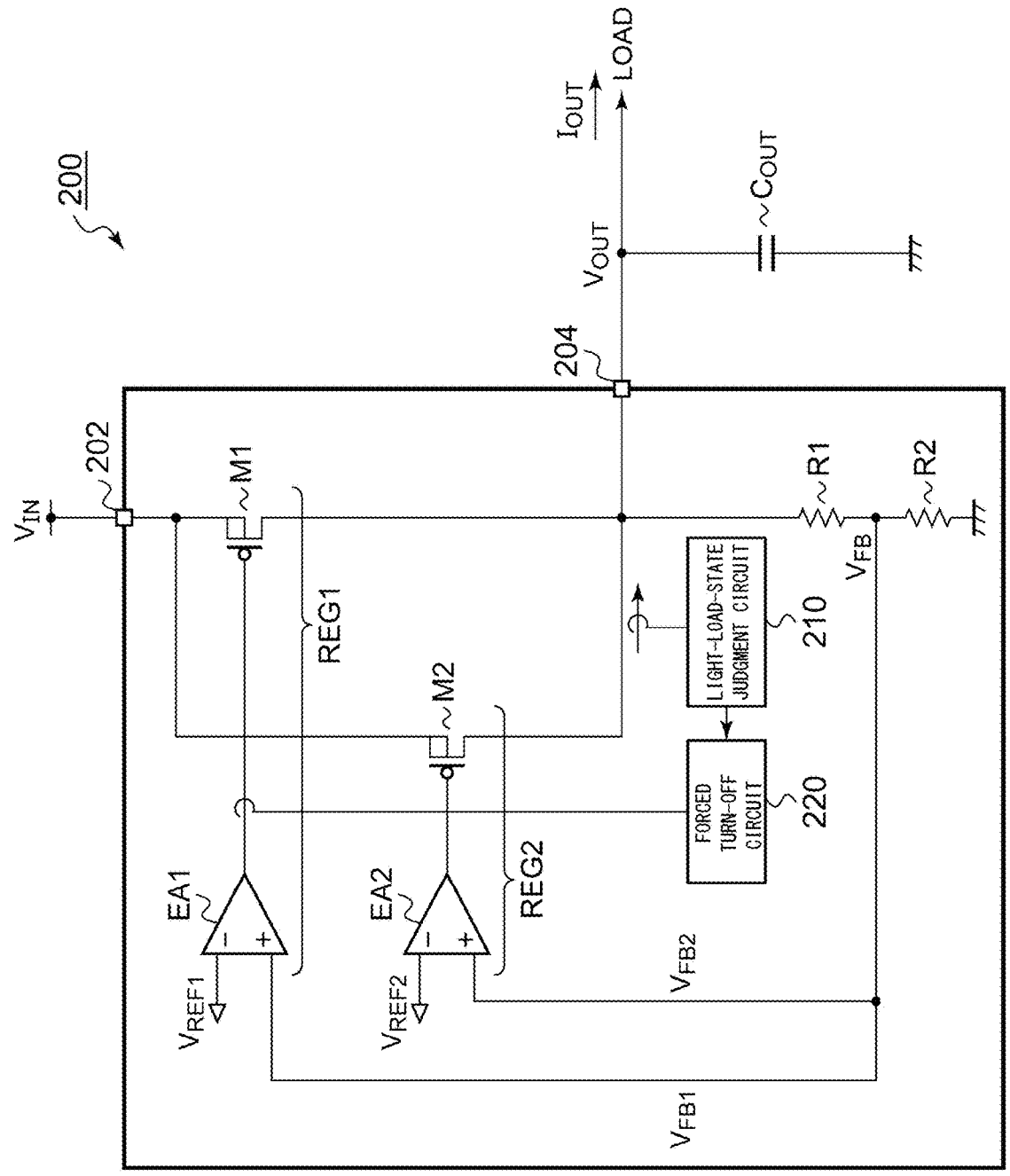
FIG. 11 is a circuit diagram showing a regulator circuit according to a second embodiment.

FIG. 11 is a circuit diagram showing a regulator circuit 200 according to a second embodiment. The regulator circuit 200 receives an input voltage $V_{IN}$ via an input terminal 202, and supplies an output voltage $V_{OUT}$ stabilized to a predetermined target voltage $V_{OUT(REF)}$ to a load (not shown) coupled to an output terminal 204.

Error amplifiers EA1 and EA2 and transistors M1 and M2 are provided in the same manner as in the first embodiment. Furthermore, a heavy-load-supporting regulator REG1 and a light-load-supporting regulator REG2 are provided in the form of a dual system.

In the second embodiment, the regulator circuit 200 is configured such that the operation of the first error amplifier EA1 is maintained even in a light-load state in the same manner as in the first embodiment. The regulator circuit 200 further includes a judgment circuit 210 and a forced turn-off circuit 220 in addition to the heavy-load-supporting regulator REG1 and the light-load-supporting regulator REG2. The judgment circuit 210 detects the light-load state. The detection method for the light-load state is not restricted in particular. For example, by comparing the current that flows through the second transistor M2 (or otherwise the first transistor M1) with a threshold value, this arrangement is capable of supporting the light-load judgment.

When the light-load state has been detected, the forced turn-off circuit 220 changes the voltage (gate voltage) of a control terminal of the first transistor M1 to a voltage level at which the first transistor M1 is substantially turned off. In a case in which the first transistor M1 is configured as a P-channel MOSFET, the gate voltage is pulled up to a value in the vicinity of the input voltage $V_{IN}$.

The above is the configuration of the regulator circuit 200. Next, description will be made regarding the advantages thereof. With this regulator circuit 200, the operation of the first error amplifier EA1 is maintained even in the light-load state. Accordingly, even if a sudden change has occurred from the light-load state to the heavy-load state, this arrangement is capable of suppressing a drop that occurs in the output voltage $V_{OUT}$ to a small value. Furthermore, this arrangement is capable of suppressing oscillation that occurs due to the turning-on/turning-off of the second error amplifier EA2.

Example 2.1

Figure 12:
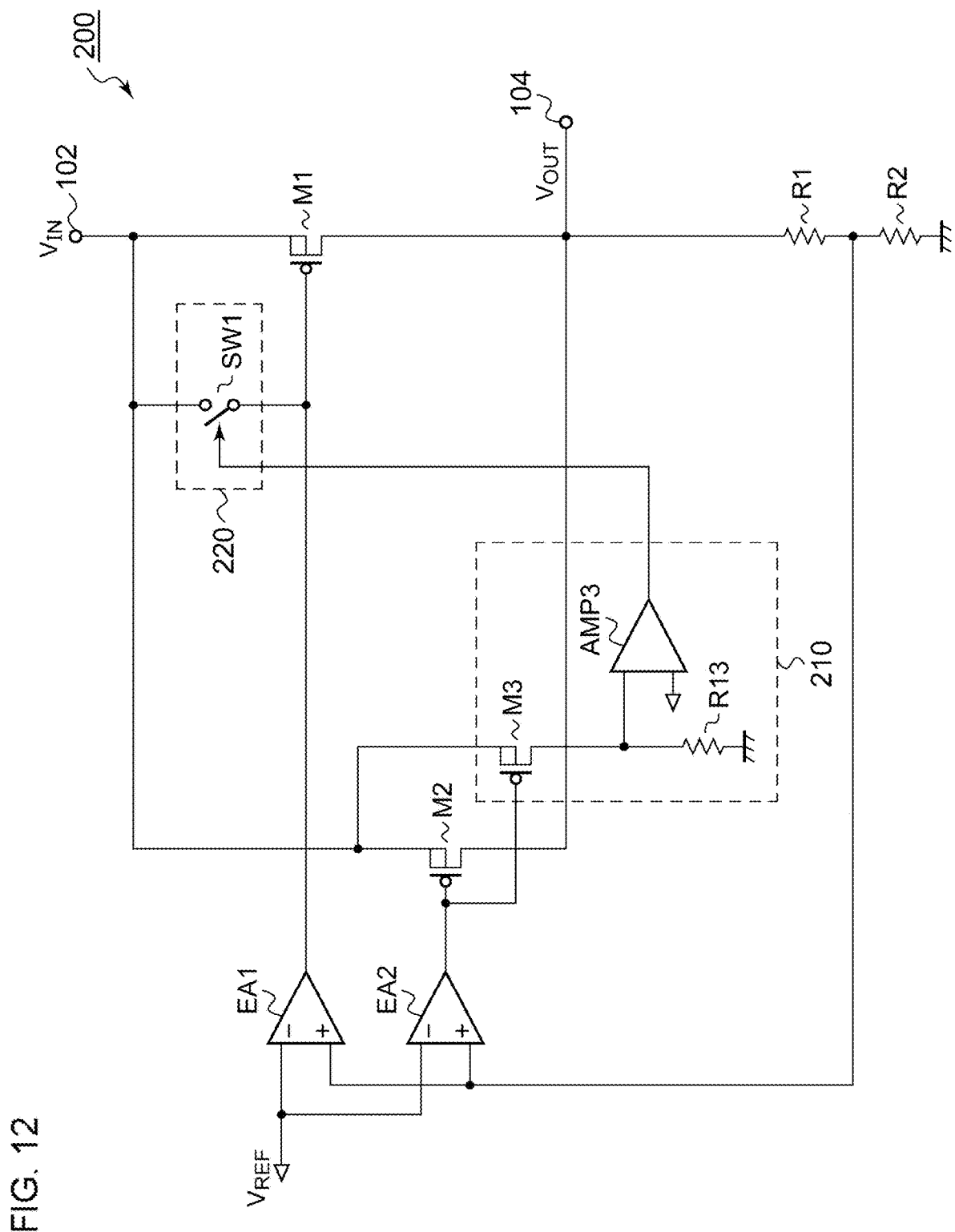
FIG. 12 is a circuit diagram showing an example 2.1 of the regulator circuit shown in FIG. 11.

FIG. 12 is a circuit diagram showing the regulator circuit 200 shown in FIG. 11 according to an example 2.1. The forced turn-off circuit 220 includes a switch SW1 arranged between the control terminal (gate) of the first transistor M1 and the input terminal 202 of the regulator circuit 200. When the state has been judged to be the light-load state, the judgment circuit 210 turns on the switch SW1 in order to turn off the first transistor M1.

The judgment circuit 210 includes a transistor M3, a resistor R13, and an amplifier AMP3. The transistor M3 is arranged such that the gate and the source thereof are respectively coupled in common with those of the second transistor M2. A detection current flows through the transistor M3 in proportion to the current that flows through the second transistor M2. A voltage drop occurs across the resistor R13 in proportion to the current that flows through the transistor M3. By comparing the voltage drop with a threshold value by means of the amplifier (comparator) AMP3, this arrangement provides light-load state judgement.

Figure 13:
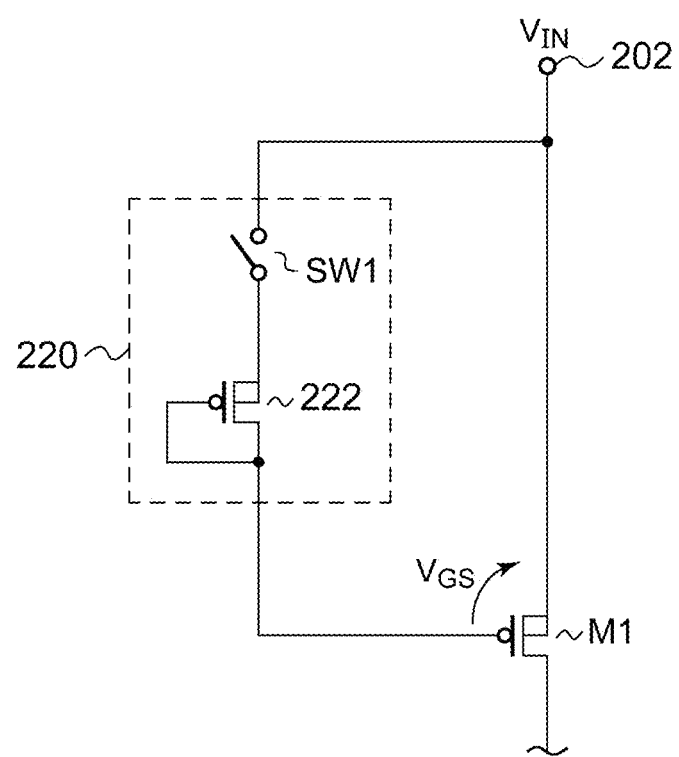
FIG. 13 is a circuit diagram showing another example configuration of a forced turn-off circuit.

FIG. 13 is a circuit diagram showing another example configuration of the forced turn-off circuit 220. The forced turn-off circuit 220 clamps the voltage $V_{GS}$ between the control terminal of the first transistor M1 and the input terminal 202 of the regulator circuit 200 such that it does not become smaller than a predetermined voltage $V_{MIN}$. The predetermined voltage $V_{MIN}$ is designed such that it is smaller than the gate-source threshold voltage $V_{GS(th)}$ of the first transistor M1 and is larger than zero. In order to provide such a function, the forced turn-off circuit 220 includes a clamp element 222 arranged in series with the switch SW1. The clamp element 222 may be configured as a diode, a MOSFET arranged such that its gate and drain are coupled, or a bipolar transistor arranged such that its base and collector are coupled.

Third Embodiment

Figure 14:
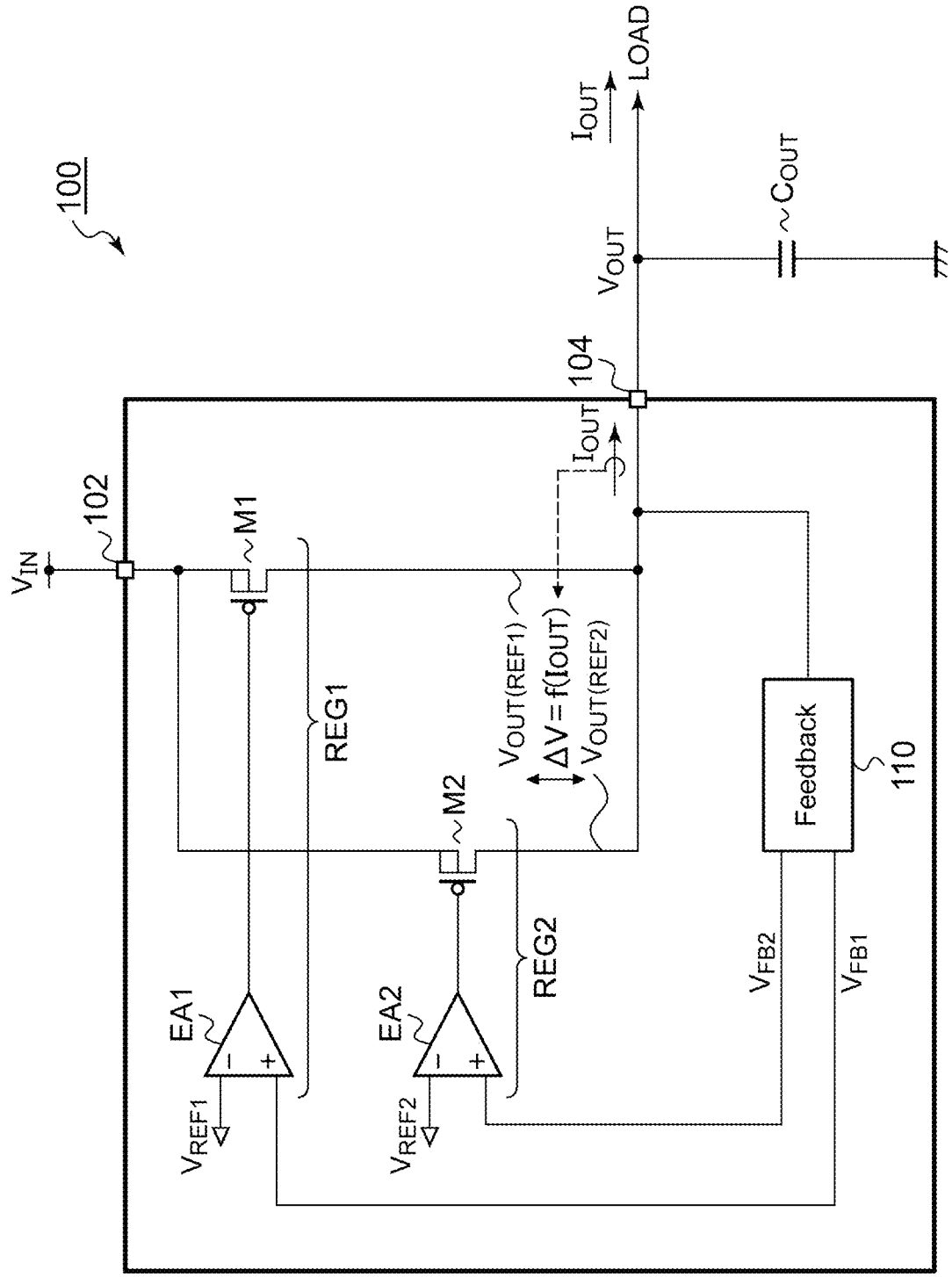
FIG. 14 is a circuit diagram showing a regulator circuit according to a third embodiment.

FIG. 14 is a circuit diagram showing a regulator circuit 100 according to a third embodiment. The regulator circuit 100 receives an input voltage $V_{IN}$ via its input terminal 102, and supplies an output voltage $V_{OUT}$ stabilized to a given target voltage $V_{OUT(REF)}$ to a load (not shown) coupled to an output terminal 104. The regulator circuit 100 is also referred to as the "LDO (Low Drop Output) circuit". An output capacitor $C_{OUT}$ is coupled to the output terminal 104 in order to smooth the output voltage $V_{OUT}$. The components of the regulator circuit 100 may be monolithically integrated on a single semiconductor substrate except for the output capacitor $C_{OUT}$.

The regulator circuit 100 includes a first transistor M1, a second transistor M2, a first error amplifier EA1, and a second error amplifier EA2. The first transistor M1 and the first error amplifier EA1 form a first linear regulator (heavy-load-supporting regulator) REG1 that is capable of supplying electric power to the load mainly in the heavy-load state. On the other hand, the second transistor M2 and the second error amplifier EA2 form a second linear regulator (light-load-supporting regulator) REG2 that is capable of supplying electric power to the load mainly in the light-load state. The second transistor M2 has an element size that is relatively smaller than that of the first transistor M1.

More specifically, the first transistor M1 and the second transistor M2 are arranged in parallel between the input terminal 102 and the output terminal 104. Description is made in the present embodiment regarding an arrangement in which the first transistor M1 and the second transistor M2 are each configured as a P-channel MOSFET. Also, the first transistor M1 and the second transistor M2 may each be configured as a PNP bipolar transistor.

A feedback circuit 110 generates a first feedback signal $V_{FB1}$ and a second feedback signal $V_{FB2}$ that correspond to the output voltage $V_{OUT}$. Typically, the feedback circuit 110 is configured as a resistor voltage dividing circuit. However, in a case in which the regulator circuit 100 is configured as buffer (voltage follower circuit), the feedback circuit 110 may be configured as a simple wiring circuit.

The first error amplifier EA1 controls a voltage (gate voltage) applied to a control terminal (gate) of the first transistor M1 such that the first feedback signal $V_{FB1}$ approaches a first reference voltage $V_{REF1}$. Furthermore, the second error amplifier EA2 controls a gate voltage of the second transistor M2 such that the second feedback signal $V_{FB2}$ approaches a second reference voltage $V_{REF2}$.

The target voltage $V_{OUT(REF2)}$ of the output voltage $V_{OUT}$ to be generated by the light-load-supporting linear regulator REG2 configured as a combination of the second transistor M2 and the second amplifier EA2 is set to a value that is slightly higher than the target voltage $V_{OUT(REF1)}$ of the output voltage $V_{OUT}$ to be generated by the heavy-load-supporting linear regulator REG1 configured as a combination of the first transistor M1 and the first error amplifier EA1.

$$V_{OUT(REF2)} > V_{OUT(REF1)}$$

As an example, in an application with $V_{OUT}$=5V, the target voltage $V_{OUT(REF2)}$ is set to a voltage value that is several dozen mV to several hundred mV higher than the target voltage $V_{OUT(REF1)}$.

In a case in which the target voltage $V_{OUT(REF2)}$ of the light-load-supporting regulator REG2 is fixed to be higher than the target voltage $V_{OUT(REF1)}$ of the heavy-load-supporting regulator REG1, in the heavy-load state, the light-load-supporting regulator REG2 operates in a state in which the second transistor M2 is fully turned on. Accordingly, when a change has occurred in the input voltage $V_{IN}$, the change in the input voltage $V_{IN}$ manifests as a change in the output voltage $V_{OUT}$. That is to say, in some cases, this arrangement has a problem of a degraded PSRR (power supply rejection ratio).

In order to solve such a problem, this arrangement dynamically changes the difference ΔV between the target voltage $V_{OUT(REF2)}$ of the light-load-supporting regulator REG2 and the target voltage $V_{OUT(REF1)}$ of the heavy-load-supporting regulator REG1 according to the state of the load (i.e., load current $I_{OUT}$). That is to say, the difference ΔV is represented by a function $f(I_{OUT})$ with respect to the load current $I_{OUT}$.

$$\Delta V = f(I_{OUT})$$

By dynamically changing the target voltage $V_{OUT(REF2)}$ in order to prevent the transistor M2 of the light-load-supporting regulator REG2 from fully turning on, this arrangement provides an improved power supply rejection ratio.

Preferably, the target voltage $V_{OUT(REF2)}$ of the light-load-supporting regulator REG2 is designed such that it becomes higher than the target voltage $V_{OUT(REF1)}$ of the heavy-load-supporting regulator REG1 in the light-load state, and it approaches the target voltage $V_{OUT(REF1)}$ in the heavy-load state.

The above is the configuration of the regulator circuit 100. Next, description will be made regarding the operation thereof.

First, for ease of understanding, description will be made regarding an arrangement in which the difference (voltage difference ΔV) between $V_{OUT(REF1)}$ and $V_{OUT(REF2)}$ is fixed.

Figure 15:
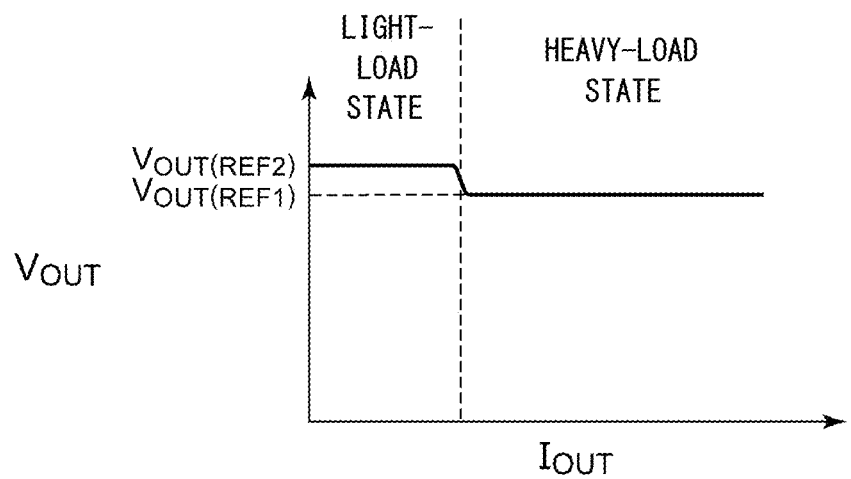
FIG. 15 is a diagram showing an operation of the regulator circuit shown in FIG. 14 when a voltage difference $\Delta V$ is fixed.

FIG. 15 is a diagram showing an operation of the regulator circuit 100 shown in FIG. 14 in a case in which the voltage difference ΔV is fixed. The horizontal axis represents the load current Iour, and the vertical axis represents the output voltage $V_{OUT}$. The boundary between the heavy-load state and the light-load state is indicated by the dashed line.

A combination of the first transistor M1 and the first error amplifier EA1 has a larger capacity. Accordingly, in the heavy-load state, the output voltage $V_{OUT}$ is stabilized to the first target voltage $V_{OUT(REF1)}$.

In the light-load state, the output voltage $V_{OUT}$ is stabilized to the second target voltage $V_{OUT(REF2)}$ by means of the second transistor M2 and the second error amplifier EA2. Even in the light-load state, the operation state of the first error amplifier EA1 is maintained. The first error amplifier EA1 generates a gate voltage $V_G$ in order to set the first transistor M1 to the off state.

When the load state transits from the light-load state to the heavy-load state, the load current $I_{OUT}$ exceeds the current supply capacity of the second transistor M2. Accordingly, the output voltage $V_{OUT}$ drops, and the first error amplifier EA1 and the first transistor M1 are automatically activated. In this state, the output voltage $V_{OUT}$ is stabilized to the first target voltage $V_{OUT(REF1)}$.

With the regulator circuit 100, by employing the light-load-supporting regulator and the heavy-load-supporting regulator in parallel, this arrangement provides an optimized phase margin and gain margin over a wide load range.

Furthermore, this arrangement is capable of automatically and seamlessly switching the regulator to be used between the heavy-load-supporting regulator REG1 and the light-load-supporting regulator REG2 according to transition between the light-load state and the heavy-load state. That is to say, this arrangement does not require a circuit configuration comparing the load current $I_{OUT}$ with a threshold value and to switch the regulator to be used between the two regulators, i.e., the regulators REG1 and REG2, according to a comparison result, which is an advantage.

In a case in which the regulator to be used is selectively switched between two regulators based on the comparison result, if the load current $I_{OUT}$ fluctuates at the boundary between the heavy-load state and the light-load state, the regulators REG1 and REG2 each repeat their on/off operations, leading to degraded circuit stability. In contrast, with the present embodiment, the regulator to be used is seamlessly switched between the regulators REG1 and REG2, thereby providing improved circuit stability.

Furthermore, the operation of the first error amplifier EA1 is maintained even in the light-load state. Accordingly, this arrangement is capable of immediately turning on the first transistor M1 even if the load current $I_{OUT}$ suddenly rises. This arrangement is capable of preventing the output voltage $V_{OUT}$ from further falling beyond $V_{OUT(REF1)}$.

Next, description will be made regarding the operation in a case in which the voltage difference $\Delta V$ is dynamically changed.

Figure 16:
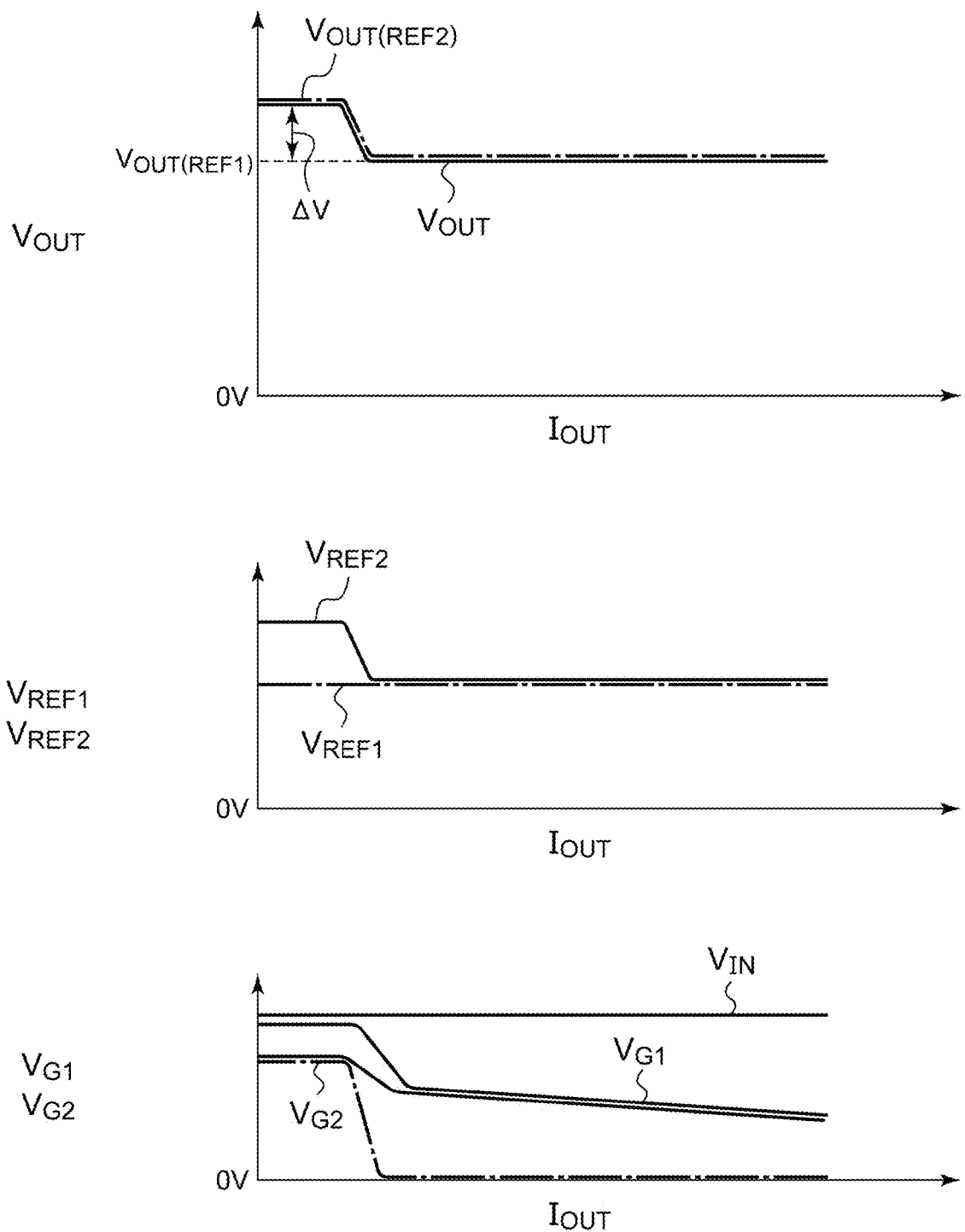
FIG. 16 is a diagram showing an operation of the regulator circuit shown in FIG. 14 when the voltage difference $\Delta V$ is changed according to a first embodiment.

FIG. 16 is a diagram showing an operation of the regulator circuit 100 shown in FIG. 14 in a case in which the voltage reference $\Delta V$ is changed according to the first embodiment. In the light-load state, the gate voltage $V_{G1}$ of the first transistor M1 becomes substantially the same as the input voltage $V_{IN}$. In this state, the current $I_{OUT1}$ that flows through the first transistor M1 is substantially zero. The gate voltage $V_{G2}$ of the second transistor M2 is adjusted by the error amplifier EA2 such that the output voltage $V_{OUT}$ is stabilized to the target voltage $V_{OUT(REF2)}$.

In the heavy-load state, the output voltage $V_{OUT}$ is stabilized to the target voltage $V_{OUT(REF1)}$ by means of the first error amplifier EA1. In this case, in a case in which $\Delta V$ is fixed, the gate voltage $V_{G2}$ of the second transistor M2 falls to a voltage value in the vicinity of 0 V as indicated by the line of alternately long and short dashes, which fully turns on the second transistor M2. In contrast, in a case in which the voltage difference $\Delta V$ is configured as a variable voltage, in the heavy-load state, the gate voltage $V_{G2}$ of the second transistor M2 does not fall to 0 V. Instead, the gate voltage $V_{G2}$ is gradually lowered according to the load current $I_{OUT}$.

Even if a change has occurred in the input voltage $V_{IN}$ in the heavy-load state, this arrangement is capable of adjusting the gate voltage $V_{G2}$ by a feedback control operation in order to cancel out such a change in the input voltage $V_{IN}$. This provides a stabilized output voltage $V_{OUT}$.

Figure 17:
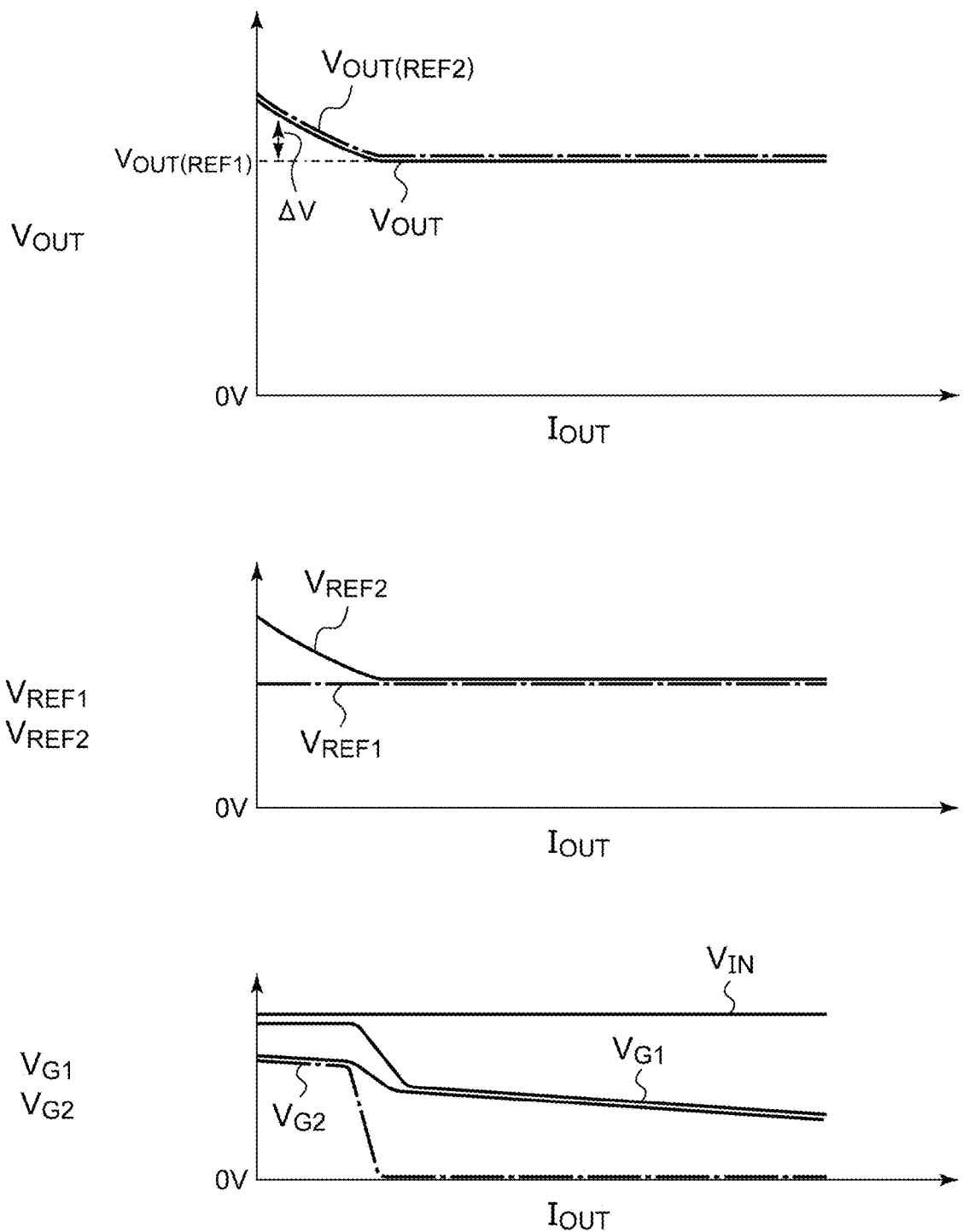
FIG. 17 is a diagram showing an operation of the regulator circuit shown in FIG. 14 when the voltage difference $\Delta V$ is changed according to a second embodiment.

FIG. 17 is a diagram for explaining an operation of the regulator circuit 100 shown in FIG. 14 when the voltage difference $\Delta V$ is changed according to a second embodiment. Description has been made with reference to FIG. 16 regarding an arrangement in which the second reference value $V_{REF2}$ is substantially changed between two values according to the load current $I_{OUT}$. Accordingly, the target voltage $V_{OUT(REF2)}$ of the light-load-supporting regulator REG2 is also changed in a discrete manner between two values. In contrast, with an arrangement shown in FIG. 17, the second reference value $V_{REF2}$ is continuously changed according to the load current $I_{OUT}$. Accordingly, the target voltage $V_{OUT(REF2)}$ is also changed in a continuous manner. It should be noted that the target value $V_{OUT(REF2)}$ for the second linear regulator REG2 may be changed in a discrete manner according to the load current $I_{OUT}$.

It should be noted that description has been made with reference to FIG. 16 and FIG. 17 regarding an arrangement in which the reference voltages $V_{REF1}$ and $V_{REF2}$ are controlled in order to change the voltage difference $\Delta V$ of the target voltage. However, as can be understood from the description of the following examples, the present invention is not restricted to such arrangements.

The present invention encompasses various apparatuses and circuits that can be regarded as a block configuration or a circuit configuration shown in FIG. 14, or otherwise that can be derived from the aforementioned description. That is to say, the present invention is not restricted to a specific configuration. More specific description will be made below regarding example configurations and modifications for clarification and ease of understanding of the essence of the present invention and the circuit operation. That is to say, the following description will by no means be intended to restrict the technical scope of the present invention.

Specific description will be made below regarding the regulator circuit 100 according to a third embodiment with reference to examples 3.1 through 3.4.

Example 3.1

Figure 18:
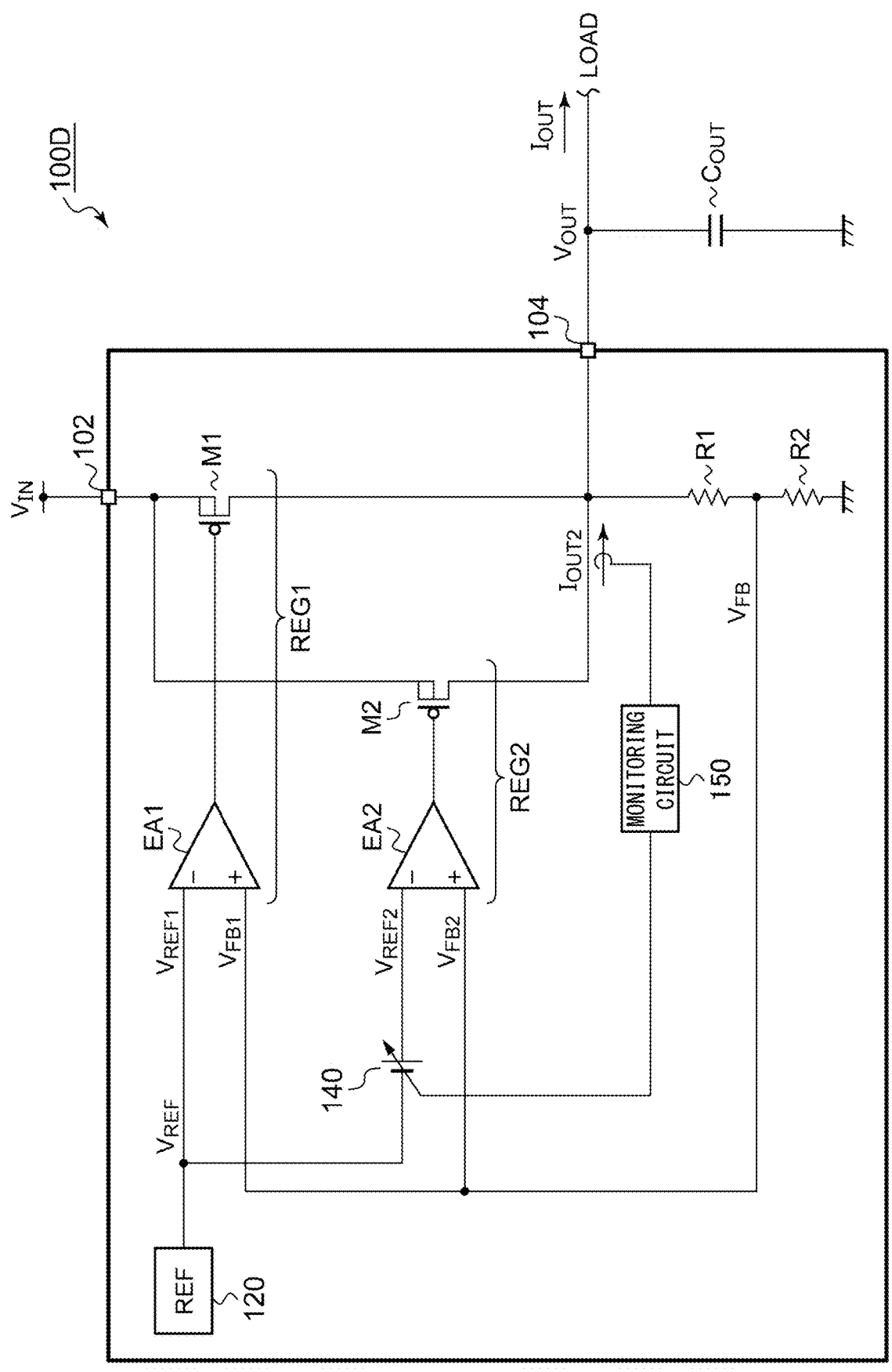
FIG. 18 is a circuit diagram showing a regulator circuit according to an example 3.1.

FIG. 18 is a circuit diagram showing a regulator circuit 100D according to an example 3.1. With this example, the relations $V_{FB1}=V_{FB2}$ and $V_{REF1} \geq V_{REF2}$ hold true. The feedback ratio $\alpha_1$ for the first feedback signal $V_{FB1}$ and the feedback ratio $\alpha_2$ for the second feedback signal $V_{FB2}$ are the same, and are represented by $\alpha=R2/(R1+R2)$.

$$V_{FB1}=V_{FB2}=V_{OUT} \times \alpha$$

With the example 3.1, the first reference value $V_{REF1}$ is fixed. For example, a reference value $V_{REF}$ generated by the reference voltage source 120 (or otherwise a voltage obtained by dividing the reference value $V_{REF}$) is employed as the first reference voltage $V_{REF1}$. With this example, the feedback signals $V_{FB1}$ and $V_{FB2}$ are the same. The second reference value $V_{REF2}$ is a voltage obtained by adding the offset $\Delta V$ that depends on the load current $I_{OUT}$ to the first reference value $V_{REF1}$.

$$V_{REF1}=V_{REF}$$

$$V_{REF2}=V_{REF1}+\Delta V$$

The regulator circuit 100D includes an offset control unit 140 and a monitoring circuit 150. The monitoring circuit 150 monitors the load current $I_{OUT}$. The offset control unit 140 adds the offset $\Delta V$ to the reference voltage $V_{REF}$. Furthermore, the offset control unit 140 changes the voltage difference $\Delta V$ between the first reference value $V_{REF1}$ and the second reference value $V_{REF2}$ based on the monitoring result obtained by the monitoring circuit 150, i.e., according to the load current $I_{OUT}$.

In the light-load state, the current $I_{OUT2}$ that flows through the second transistor M2 is substantially the same as the load current $I_{OUT}$. Accordingly, the offset control unit 140 may control the voltage difference $\Delta V$ based on the current $I_{OUT2}$ that flows through the second transistor M2. The configuration and the judgment method for judging whether the load state is the light-load state or the heavy-load state, which are employed in the monitoring circuit 150, are not restricted in particular.

The offset control unit 140 may be configured in the same manner as shown in FIG. 6A and FIG. 6B.

Figure 19:
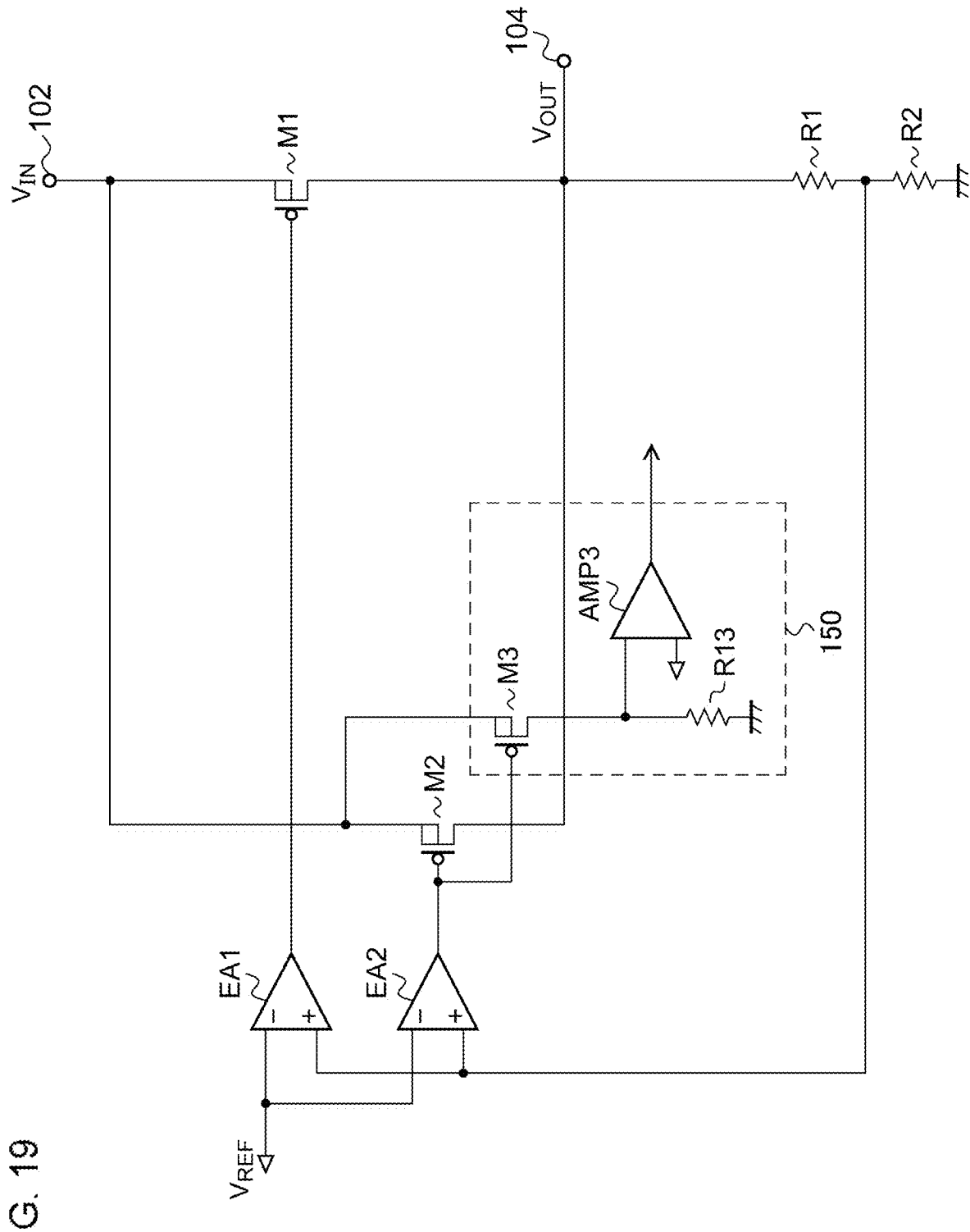
FIG. 19 is a circuit diagram showing an example configuration of a monitoring circuit that detects a load current.

FIG. 19 is a circuit diagram showing an example configuration of the monitoring circuit 150 that monitors the load current $I_{OUT}$. The monitoring circuit 150 includes a transistor M3, a resistor R13, and an amplifier AMP3. The transistor M3 is arranged such that the gate and the source thereof are respectively coupled in common with those of the second transistor M2. A detection current flows through the transistor M3 in proportion to the current that flows through the second transistor M2. A voltage drop occurs across the resistor R13 in proportion to the current that flows through the transistor M3. By comparing the voltage drop with a threshold value by means of the amplifier AMP3, this arrangement supports light-load-state judgment.

Alternatively, the amplifier AMP3 may be configured as a non-inverting amplifier or otherwise may be configured including a non-inverting amplifier. The voltage difference $\Delta V$ between the two target values $V_{OUT(REF1)}$ and $V_{OUT(REF2)}$ may be continuously changed according to the output voltage of the amplifier AMP3.

Example 3.2

Figure 20:
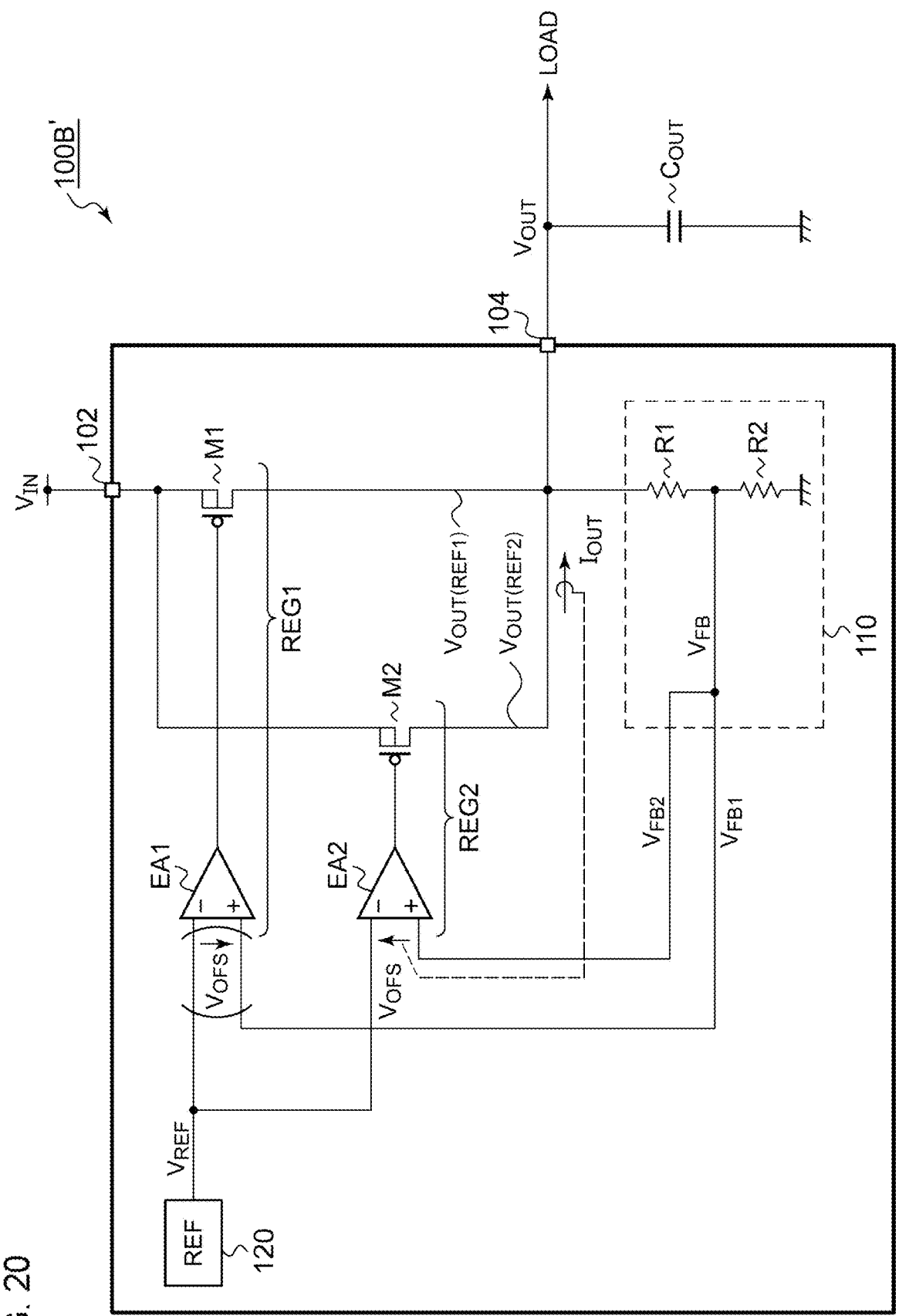
FIG. 20 is a circuit diagram showing a regulator circuit according to an example 3.2.

FIG. 20 is a circuit diagram showing a regulator circuit 100B' according to an example 3.2. With the regulator circuit 100B', a designed reference value $V_{OFS}$ is applied to the second error amplifier EA2. By applying such an input offset voltage $V_{OFS2}$, an effective reference value $V_{REF2}$ is shifted. From another viewpoint, by applying such an input offset voltage $V_{OFS2}$, it can be understood that the effective second feedback signal $V_{FB2}$ is shifted. It should be noted that, in the following description of the example, the monitoring circuit 150 will be omitted.

The first error amplifier EA1 adjusts the gate voltage of the first transistor M1 such that the relation $V_{REF}=V_{FB}$ holds true. On the other hand, the second error amplifier EA2 adjusts the gate voltage of the second transistor M2 such that the relation $V_{REF}+V_{OFS2}=V_{FB}$ holds true.

Accordingly, the following relations hold true.

$$V_{OUT(REF1)}=V_{REF}\times(R1+R2)/R2$$

$$V_{OUT(REF2)}=(V_{REF}+V_{OFS2})\times(R1+R2)/R2$$

That is to say, the relation between $V_{OUT(REF2)}$ and the $V_{OUT(REF1)}$ changes according to the offset voltage $V_{OFS2}$.

Instead of or in addition to applying the input offset voltage $V_{OFS2}$ to the second error amplifier EA2, an input offset voltage $V_{OFS1}$ may be applied to the first error amplifier EA1. In this case, the polarity of the offset voltage $V_{OFS1}$ is the reverse of that of the offset voltage $V_{OFS2}$.

In order to apply the input offset voltage $V_{OFS2}$ to the error amplifier EA2, such an arrangement may be configured in the same manner as shown in FIG. 8A and FIG. 8B. However, a configuration for applying the input offset voltage $V_{OFS}$ is not restricted to such arrangements. For example, it can be understood that the circuit configuration shown in FIG. 6A employs the input offset voltage $V_{OFS}$.

Example 3.3

Figure 21:
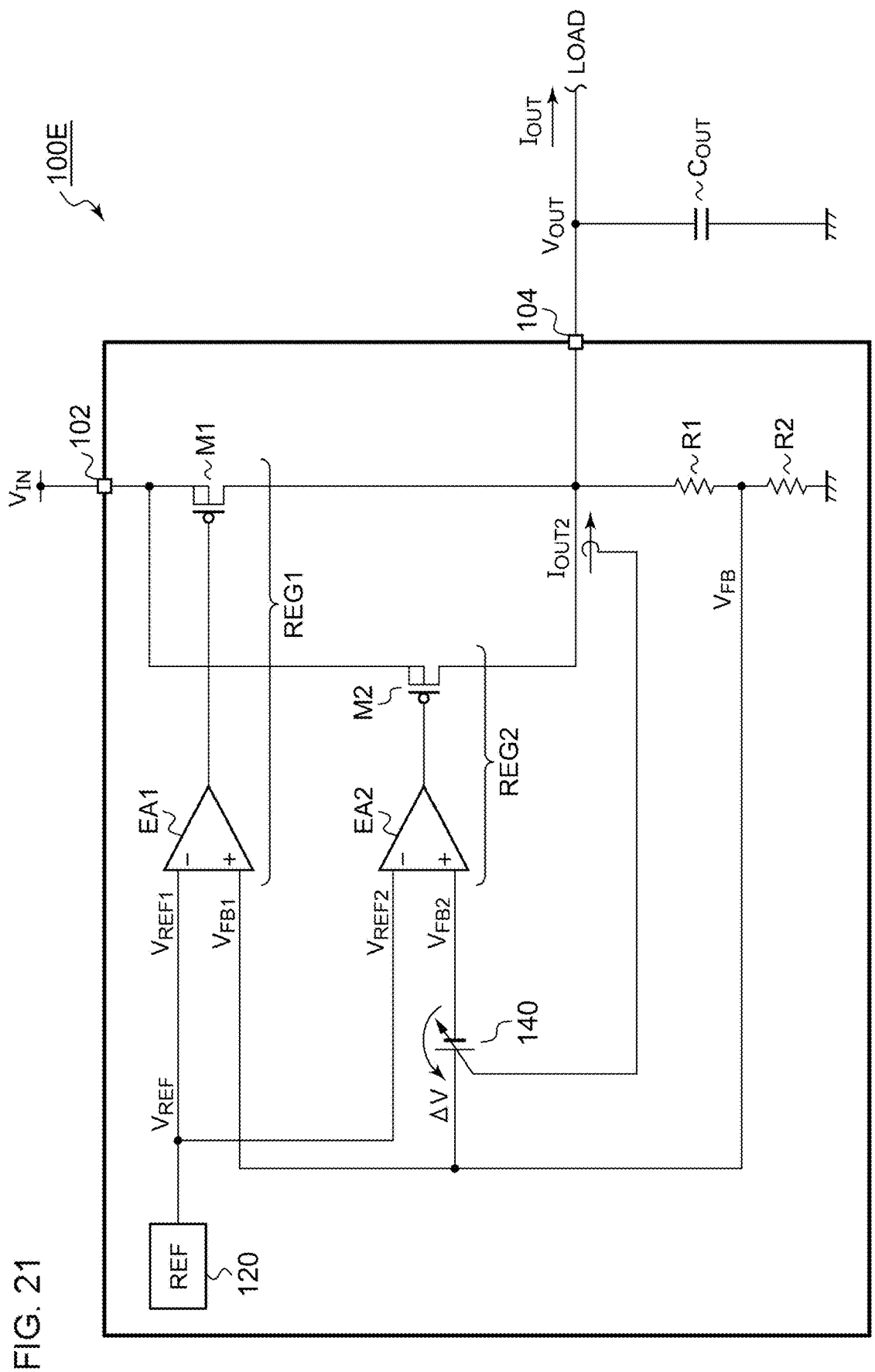
FIG. 21 is a circuit diagram showing a regulator circuit according to an example 3.3.

FIG. 21 is a circuit diagram showing a regulator circuit 100E according to an example 3.3. With this example, the same reference values $V_{REF1}$ and $V_{REF2}$ represented by $V_{REF1}=V_{REF2}=V_{REF}$ are supplied to the first error amplifier EA1 and the second error amplifier EA2, respectively.

The offset control unit 140 superimposes the offset voltage $\Delta V$ that corresponds to the load current $I_{OUT2}$ on the second feedback signal $V_{FB2}$.

$$V_{FB2}=V_{FB}-\Delta V$$

In this case, the second target voltage $V_{OUT(REF2)}$ is represented by the following Expression.

$$V_{OUT(REF2)}=(V_{REF}+\Delta V)\times(R1+R2)/R2$$

By changing $\Delta V$ between zero and a non-zero value, this arrangement is capable of changing $V_{OUT(REF2)}$.

Figure 22A:
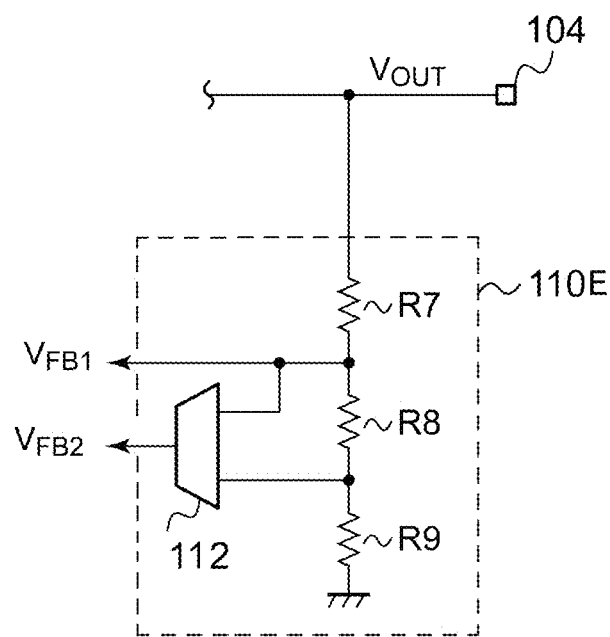
FIG. 22A and FIG. 22B are circuit diagrams each showing an example configuration of a feedback circuit shown in FIG. 21.
Figure 22B:
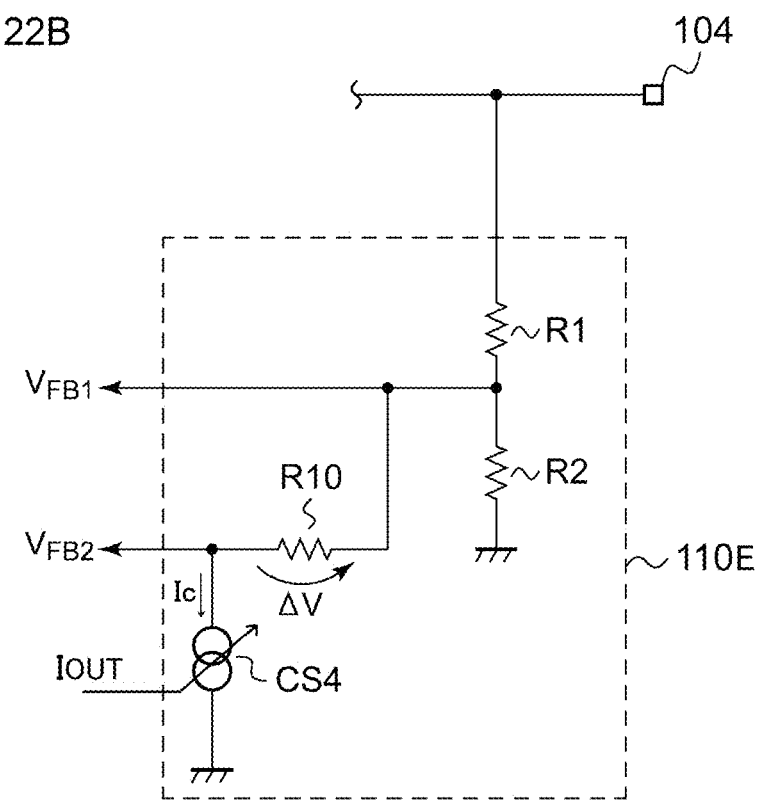

FIG. 22A and FIG. 22B are circuit diagrams each showing an example configuration of a feedback circuit 110E shown in FIG. 21. The feedback circuit 110E shown in FIG. 22A includes three resistors R7 through R9 coupled in series and a selector 112. One of the feedback signals, i.e., the feedback signal $V_{FB1}$, is drawn from a predetermined tap. The selector 112 selects one voltage from among the voltages at the two taps according to the load current $I_{OUT}$, and outputs the selected voltage as the other feedback signal $V_{FB2}$. The voltage drop that occurs across the resistor R8 corresponds to the offset voltage $\Delta V$.

From another viewpoint, it can be understood that the feedback ratio of the feedback signal $V_{FB2}$ is changed between two values.

$$\alpha_1=(R8+R9)/(R7+R8+R9)$$

$$\alpha_2=R9/(R7+R8+R9)$$

The feedback circuit 110E shown in FIG. 22B has a configuration including a resistor R10 and a current source CS4. By supplying a current Ic generated by the current source CS4 such that it flows through the resistor R10, a voltage drop occurs across the resistor R10. This voltage drop is employed as the offset voltage. By changing the current Ic according to the load current $I_{OUT}$, this arrangement is capable of controlling the offset voltage.

Example 3.4

Figure 23:
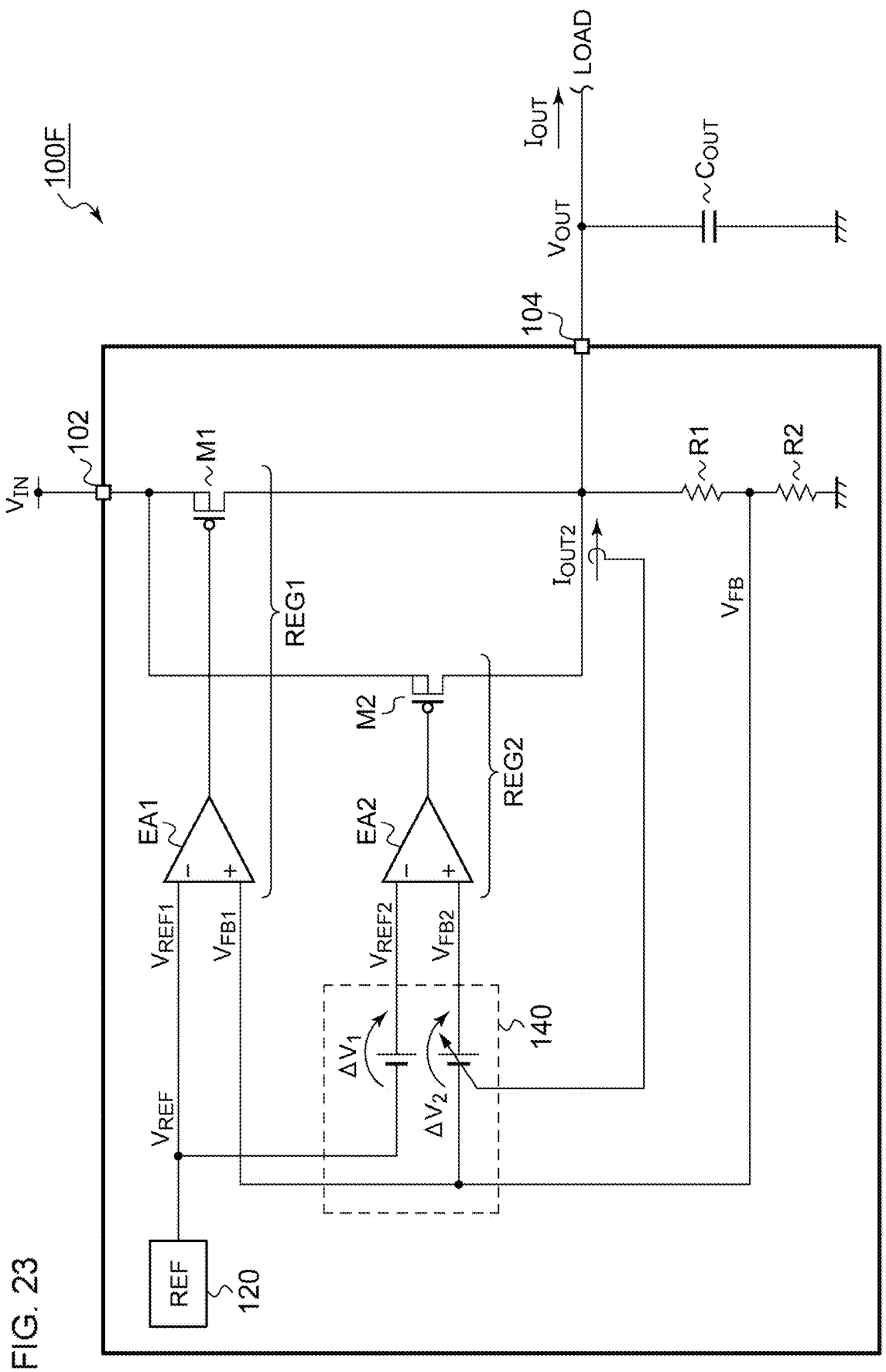
FIG. 23 is a circuit diagram showing a regulator circuit according to an example 3.4.

FIG. 23 is a circuit diagram showing a regulator circuit 100F according to an example 3.4. With this example, the relation $V_{REF2}=V_{REF1}+\Delta V_1$ holds true. The offset control unit 140 superimposes an offset voltage $\Delta V_2$ that corresponds to the load current $I_{OUT2}$ on the second feedback signal $V_{FB2}$. The offset voltages $\Delta V_1$ and $\Delta V_2$ are designed to have the same polarity.

$$V_{REF2}=V_{REF}+\Delta V_1$$

$$V_{FB2}=V_{FB}+\Delta V_2$$

In this case, the second target voltage $V_{OUT(REF2)}$ is represented by the following Expression.

$$V_{OUT(REF2)}=(V_{REF}+\Delta V_1-\Delta V_2)\times(R1+R2)/R2$$

In the light-load state, $\Delta V_2$ is set to 0. In this state, the target voltage $V_{OUT(REF2)}$ becomes larger than $V_{OUT(REF1)}$. In the heavy-load state, the relation $\Delta V_1=\Delta V_2$ holds true. In this state, the relation $V_{OUT(REF2)}=V_{OUT(REF1)}$ holds true.

Figure 24:
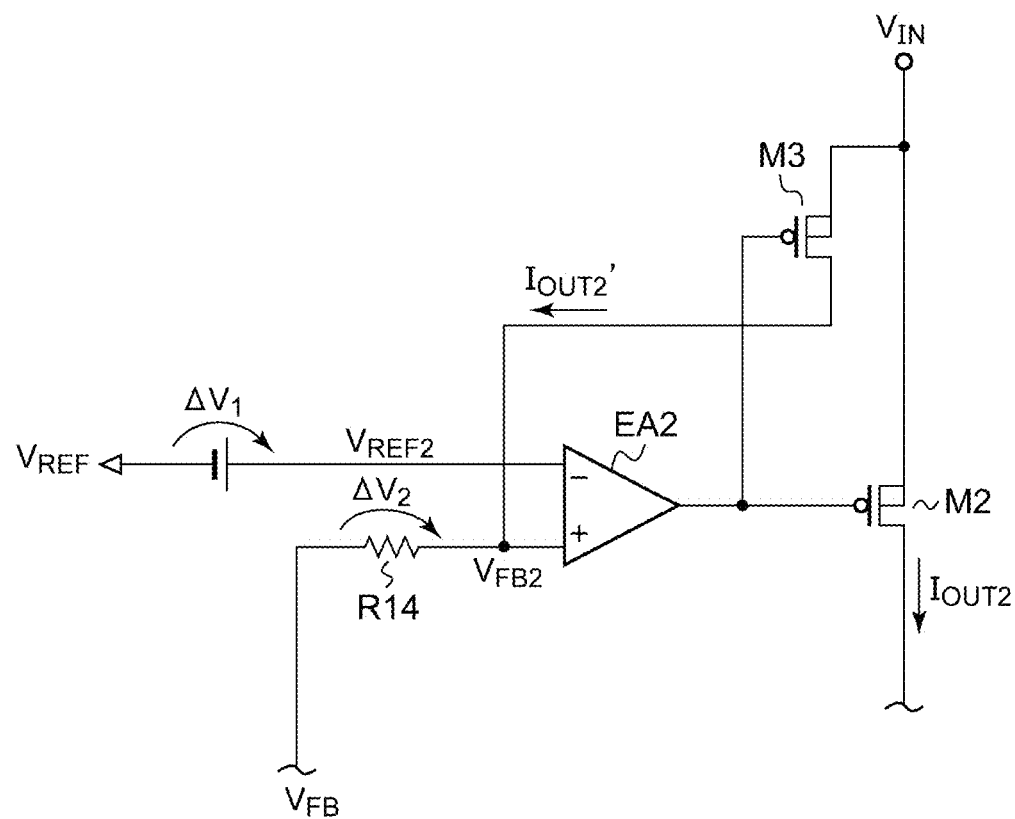
FIG. 24 is a circuit diagram showing an example configuration of a part of the regulator circuit shown in FIG. 23.

FIG. 24 is a circuit diagram showing an example configuration of a part of the regulator circuit 100F shown in FIG. 23. A transistor M3 has its gate and its source respectively coupled in common with those of the transistor M2. A detection current $I_{OUT2}'$ that corresponds to the current $I_{OUT2}$ flows through the transistor M3. The detection current $I_{OUT2}'$ is supplied such that it flows through the resistor R14. This generates a voltage drop across the resistor R14, which is employed as the offset voltage $\Delta V_2$. With this arrangement, in the light-load state, the detection current $I_{OUT2}'$ becomes small such that the relation $\Delta V_2=0$ holds true. In the heavy-load state, the detection current $I_{OUT2}'$ becomes large, which raises the offset voltage $\Delta V_2$. With the configuration shown in FIG. 24, this arrangement provides the operation shown in FIG. 17.

Example 3.5

Figure 25:
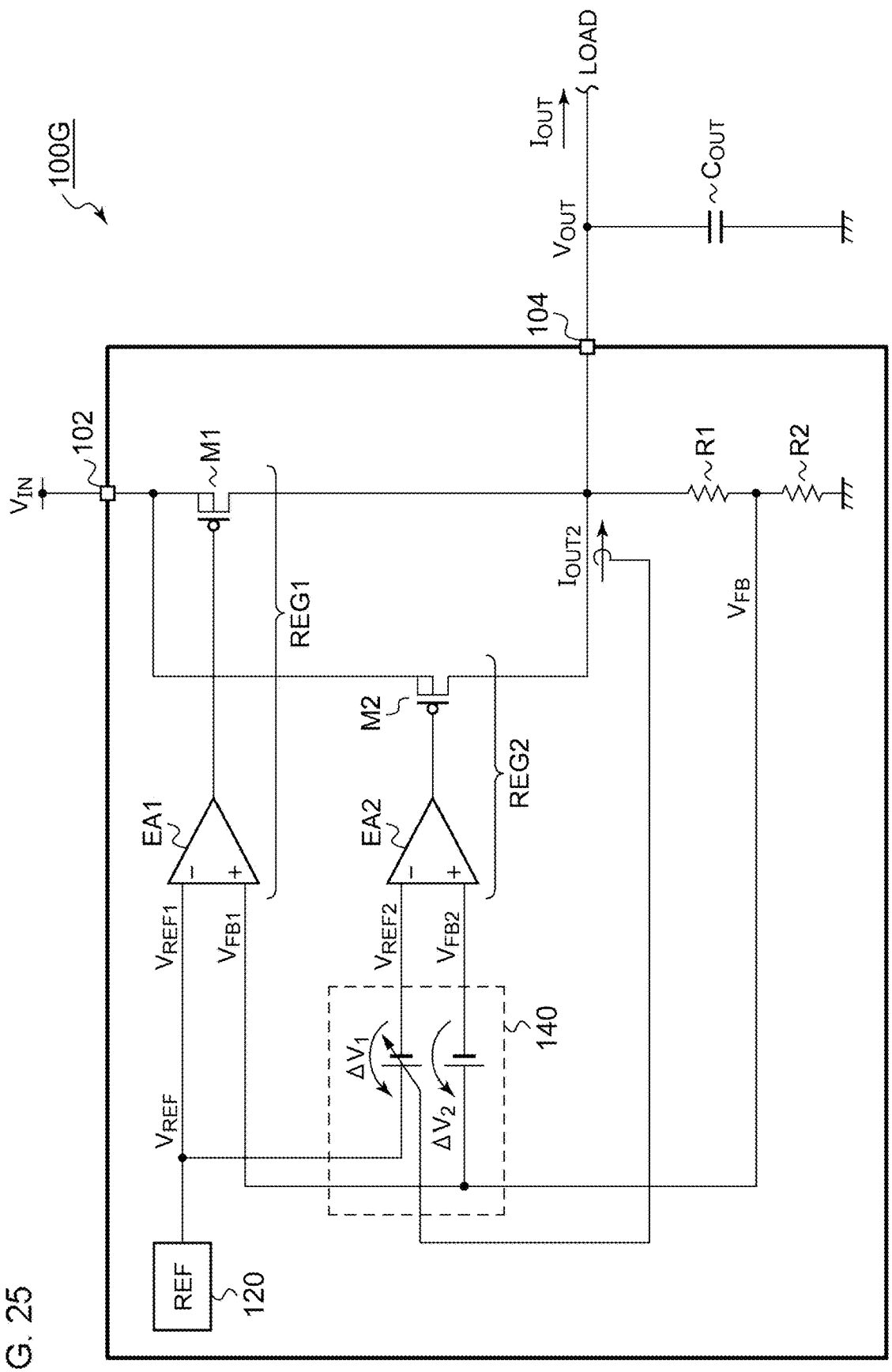
FIG. 25 is a circuit diagram showing a regulator circuit according to an example 3.5.

FIG. 25 is a circuit diagram showing a regulator circuit 100G according to an example 3.5. In this example, the offset voltages are each designed to have a polarity that is the reverse of that shown in FIG. 22. Furthermore, the offset voltage $\Delta V_1$ is configured as a variable voltage.

$$V_{REF2}=V_{REF}-\Delta V_1$$

$$V_{FB2}=V_{FB}-\Delta V_2$$

In this example, the second target voltage $V_{OUT(REF2)}$ is represented by the following Expression.

$$V_{OUT(REF2)}=(V_{REF}-\Delta V_1+\Delta V_2)\times(R1+R2)/R2$$

In the light-load state, $\Delta V_1$ is set to 0. In this case, $V_{OUT(REF2)}$ becomes larger than $V_{OUT(REF1)}$. In the heavy-load state, the relation $\Delta V_1 = \Delta V_2$ holds true. In this state, the relation $V_{OUT(REF2)} = V_{OUT(REF1)}$ holds true.

Fourth Embodiment

Description has been made in the third embodiment regarding an arrangement in which the heavy-load-supporting first error amplifier EA1 maintains its operation over the entire current range in the light-load state. Accordingly, this arrangement has a problem in that current consumption of the first error amplifier EA1 cannot be reduced in the light-load state. Description will be made in the fourth embodiment regarding an arrangement solving this problem.

Figure 26:
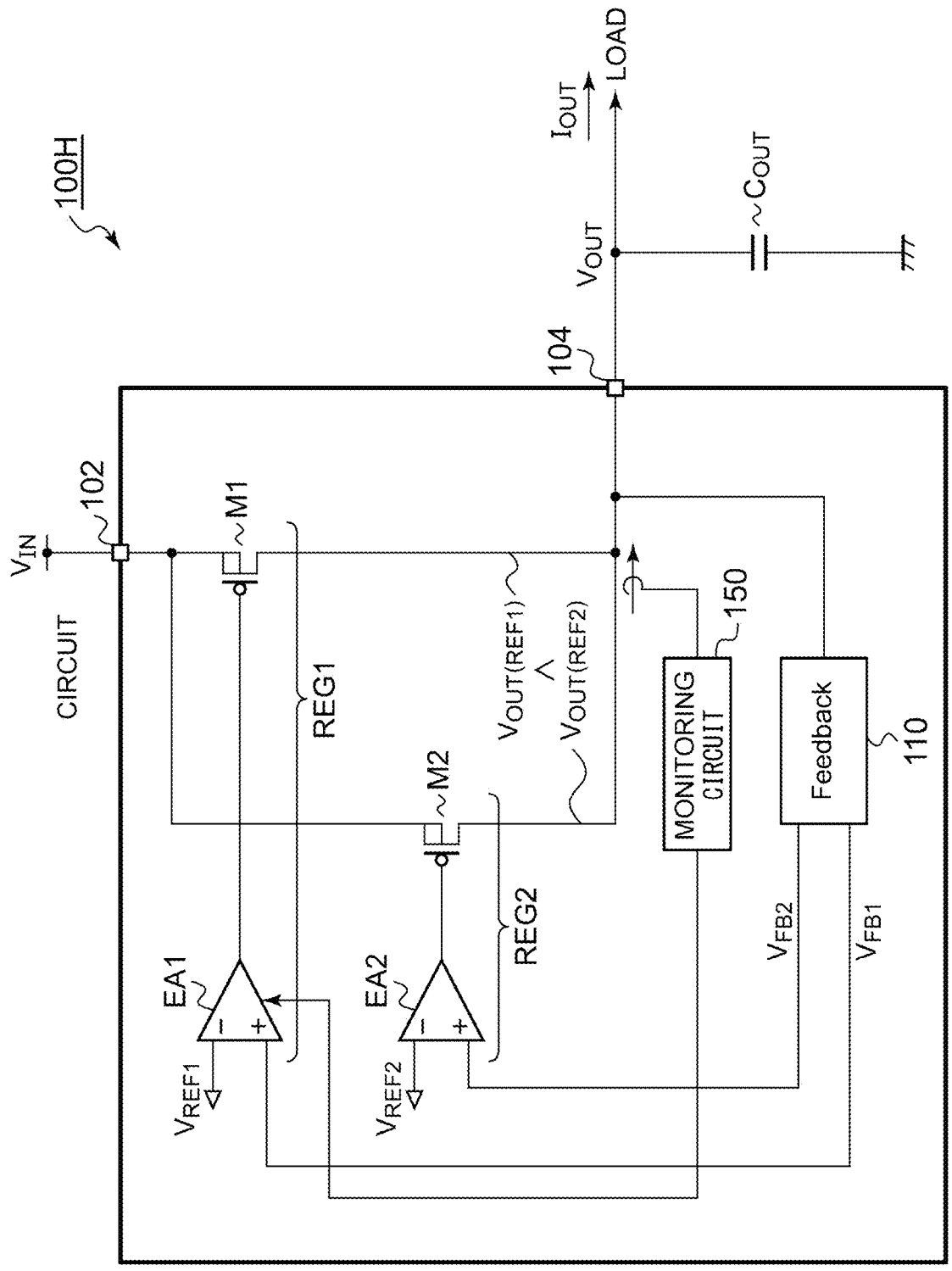
FIG. 26 is a circuit diagram showing a regulator circuit according to a fourth embodiment.

FIG. 26 is a circuit diagram showing a regulator circuit 100H according to the fourth embodiment. With the regulator circuit 100H, the following relation also holds true between the target voltage $V_{OUT(REF1)}$ of the heavy-load-supporting regulator REG1 and the target voltage $V_{OUT(REF2)}$ of the light-load-supporting regulator REG2.

$$V_{OUT(REF2)} > V_{OUT(REF1)}$$

As the basic configuration of the regulator circuit 100H, in order to satisfy the above-described relation, any one of the examples described in the third embodiment may be employed.

With the regulator circuit 100H, when the load current $I_{OUT}$ is smaller than a threshold current $I_{MIN}$ defined within the range of the light-load state, the first error amplifier EA1 is turned off. The threshold current $I_{MIN}$ is designed to be lower than the current $I_{TH}$ that defines the boundary between the heavy-load state and the light-load state. For example, in a case in which $I_{TH}=1$ mA, the threshold current $I_{MIN}$ may be set to a current value on the order of 100 μA, which is ⅒ of that of the threshold current $I_{TH}$.

The regulator circuit 100H further includes a monitoring circuit 150 that compares the load current $I_{OUT}$ with a threshold current $I_{MIN}$. The on/off operation of the first error amplifier EA1 is controlled based on the judgment result obtained by the monitoring circuit 150.

Figure 27:
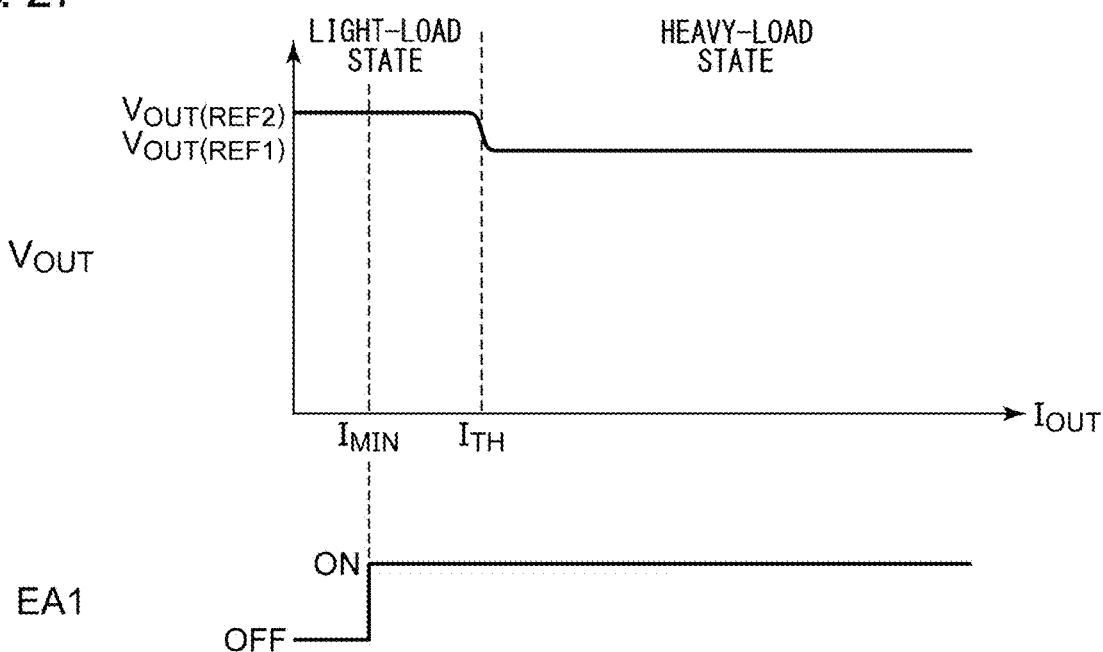
FIG. 27 is a diagram for explaining the operation of the regulator circuit shown in FIG. 26.

The above is the configuration of the regulator circuit 100H. Next, description will be made regarding the operation thereof. FIG. 27 is a diagram for explaining the operation of the regulator circuit 100H shown in FIG. 26. In a minimum-load state in which the load current $I_{OUT}$ is smaller than the threshold current $I_{MIN}$, the first error amplifier EA1 is turned off, thereby minimizing the circuit operation current.

When the load current $I_{OUT}$ becomes larger than the threshold current $I_{MIN}$, the first error amplifier EA1 comes to be in the operation state in preparation for the transition to the heavy-load state. When the load current $I_{OUT}$ further rises up to the current amount $I_{TH}$ which is the boundary between the light-load state and the heavy-load state, the control operation of the first error amplifier EA1 becomes dominant. In this state, the output voltage $V_{OUT}$ is stabilized to the first target value $V_{OUT(REF1)}$.

As described above, the regulator circuit 100H according to the fourth embodiment provides reduced power consumption in the minimum-load state as well as automatic and seamless switching between the two regulators, i.e., the regulators REG1 and REG2, according to the transition between the light-load state and the heavy-load state.

Example 4.1

Figure 28:
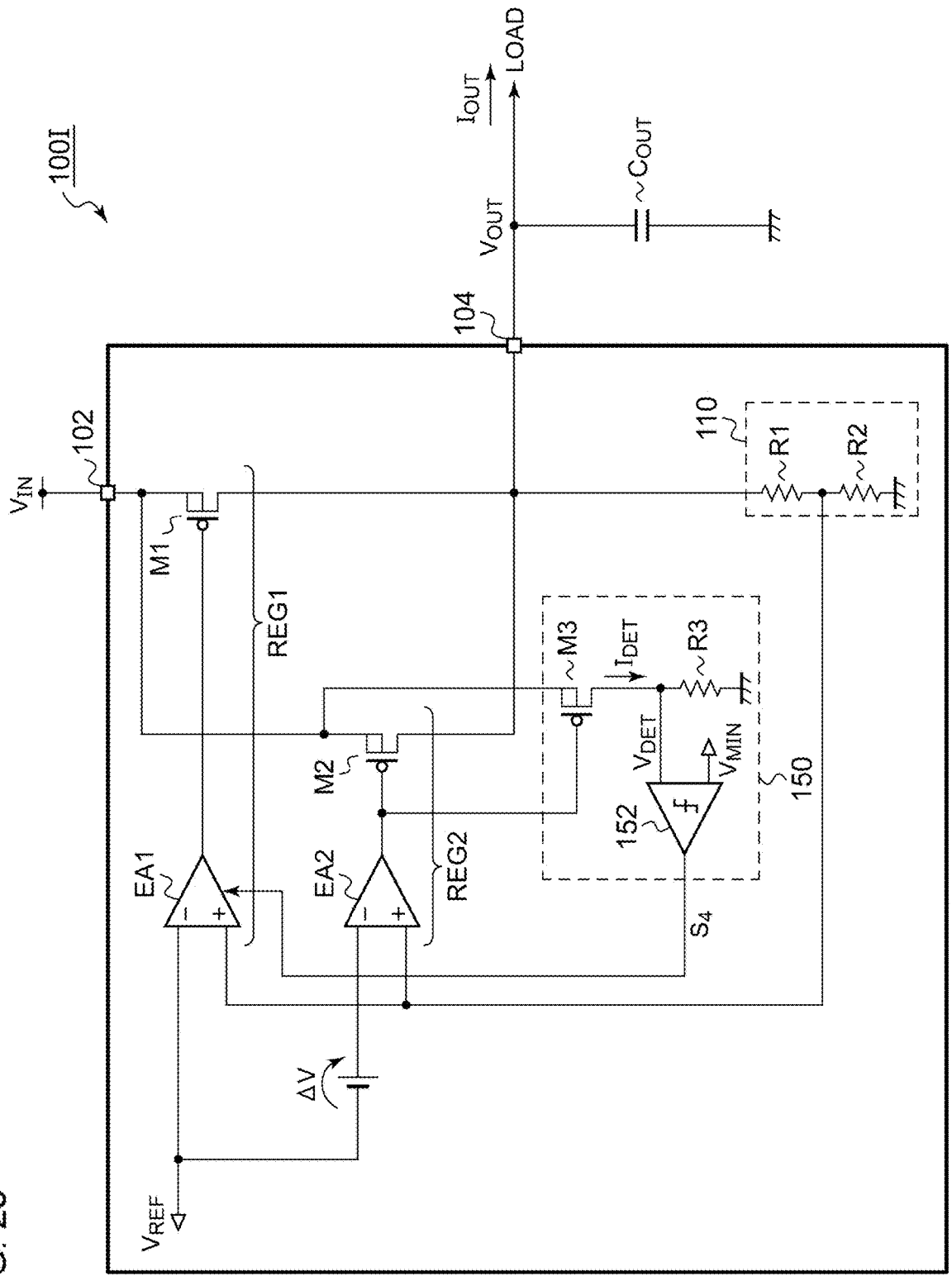
FIG. 28 is a circuit diagram showing a regulator circuit according to an example 4.1.

FIG. 28 is a circuit diagram showing a regulator circuit 100I according to an example 4.1. The regulator circuit 100I has the same basic configuration as that of the regulator circuit 100A shown in FIG. 16.

The monitoring circuit 150 judges, based on the current $I_{OUT2}$ that flows through the second transistor M2, whether or not the load state is the minimum-load state. The monitoring circuit 150 includes a third transistor M3 and a sensing resistor R3. The third transistor M3 is arranged such that the control terminal (gate) and the source thereof are respectively coupled in common with those of the transistor M2. A detection current $I_{DET}$ flows through the third transistor M3 in proportion to the current $I_{OUT2}$ that flows through the second transistor M2. The sensing resistor R3 is arranged on a path of the detection current $I_{DET}$. A voltage drop occurs across the sensing resistor R3 in proportion to the detection current $I_{DET}$, i.e., to the current $I_{OUT2}$. The monitoring circuit 150 compares the voltage drop (detection voltage $V_{DET}$) with a threshold voltage $V_{MIN}$ that corresponds to the threshold current $I_{MIN}$ in order to detect the minimum-load state. The monitoring circuit 150 may include a voltage comparator as a voltage comparator unit 152. Also, a MOS transistor may be arranged such that the detection voltage $V_{DET}$ is applied across the gate and source thereof, which may be employed as such a comparator. The output of the voltage comparator unit 152 is applied to the first error amplifier EA1 as a judgment signal S4 that indicates whether or not the load state is the minimum-load state.

Figure 29A:
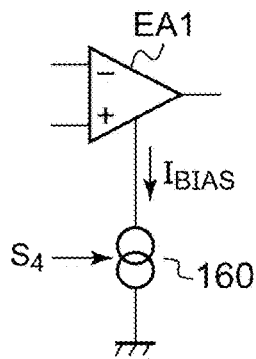
FIG. 29A through FIG. 29D are circuit diagrams each showing an example configuration of a part of the configuration relating to the on/off control operation of the first error amplifier.

FIG. 29A through FIG. 29D are circuit diagrams each showing an example configuration of a part of the configuration relating to the on/off control operation of the first error amplifier EA1. As shown in FIG. 29A, the switching of the on/off operation of the first error amplifier EA1 may be controlled according to the on/off operation of a bias current source 160 that generates the bias current $I_{BIAS}$.

Figure 29B:
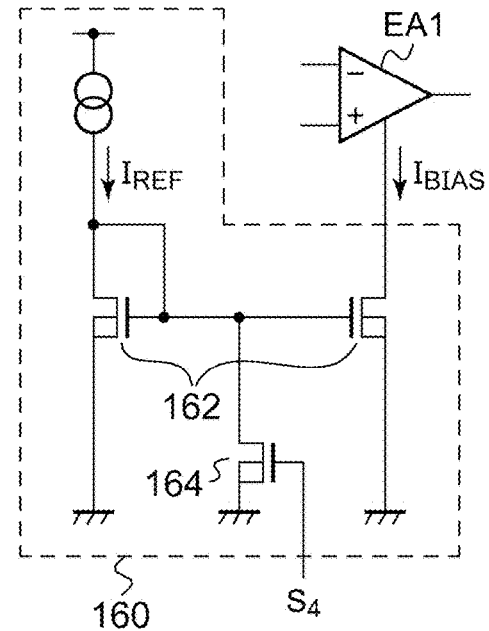

As shown in FIG. 29B, the bias current source 160 may include a current mirror circuit 162 that mirrors the reference current $I_{REF}$. By turning on and off a transistor 164 coupled to the gate of the current mirror circuit 162, this arrangement is capable of controlling the bias current $I_{BIAS}$. For example, the judgement signal S4 may be designed such that its signal level becomes the high level in the minimum-load state. Also, the judgment signal S4 thus designed may be supplied to the gate of the transistor 164. With this arrangement, the transistor 164 is turned on in the minimum-load state. In this state, the current mirror circuit 162 is turned off, and the bias current $I_{BIAS}$ is cut off.

Figure 29C:
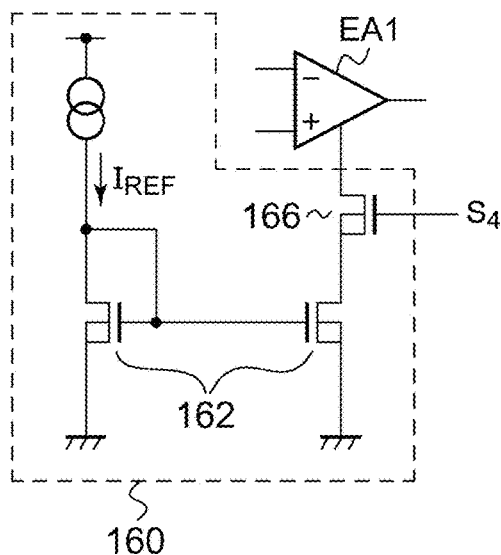

FIG. 29C shows an arrangement in which a transistor 166 is arranged on a path of the bias current $I_{BIAS}$. By turning on and off the transistor 166, this arrangement is capable of controlling the bias current $I_{BIAS}$. For example, the judgment signal S4 may be designed such that its signal level becomes the low level in the minimum-load state. Also, the judgment signal S4 thus designed may be supplied to the gate of the transistor 164. With this arrangement, the transistor 166 is turned off in the minimum-load state, which cuts off the bias current $I_{BIAS}$. With this arrangement, the detection voltage $V_{DET}$ shown in FIG. 27 may be supplied to the gate of the transistor 166 such that it functions as the voltage comparator unit 152.

Figure 29D:
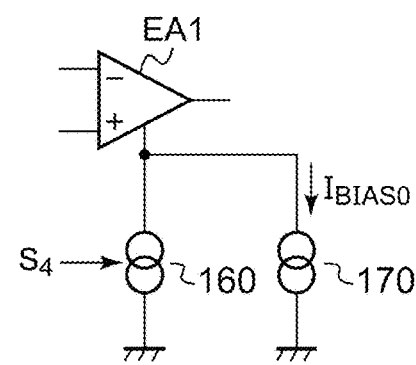

FIG. 29D shows an arrangement in which a current source 170 is provided in addition to the bias current source 160. In the minimum-load state, the current source 170 supplies a non-zero, very small bias current $I_{BIAS0}$ to the error amplifier EA1. With this arrangement, instead of completely turning off the first error amplifier EA1, a minimum necessary current $I_{BIAS0}$ is supplied to the first error amplifier EA1 such that it comes be in a standby state. This provides improved responsivity with respect to a sudden change in the load state from the minimum-load state to the heavy-load state.

Fifth Embodiment

Figure 30:
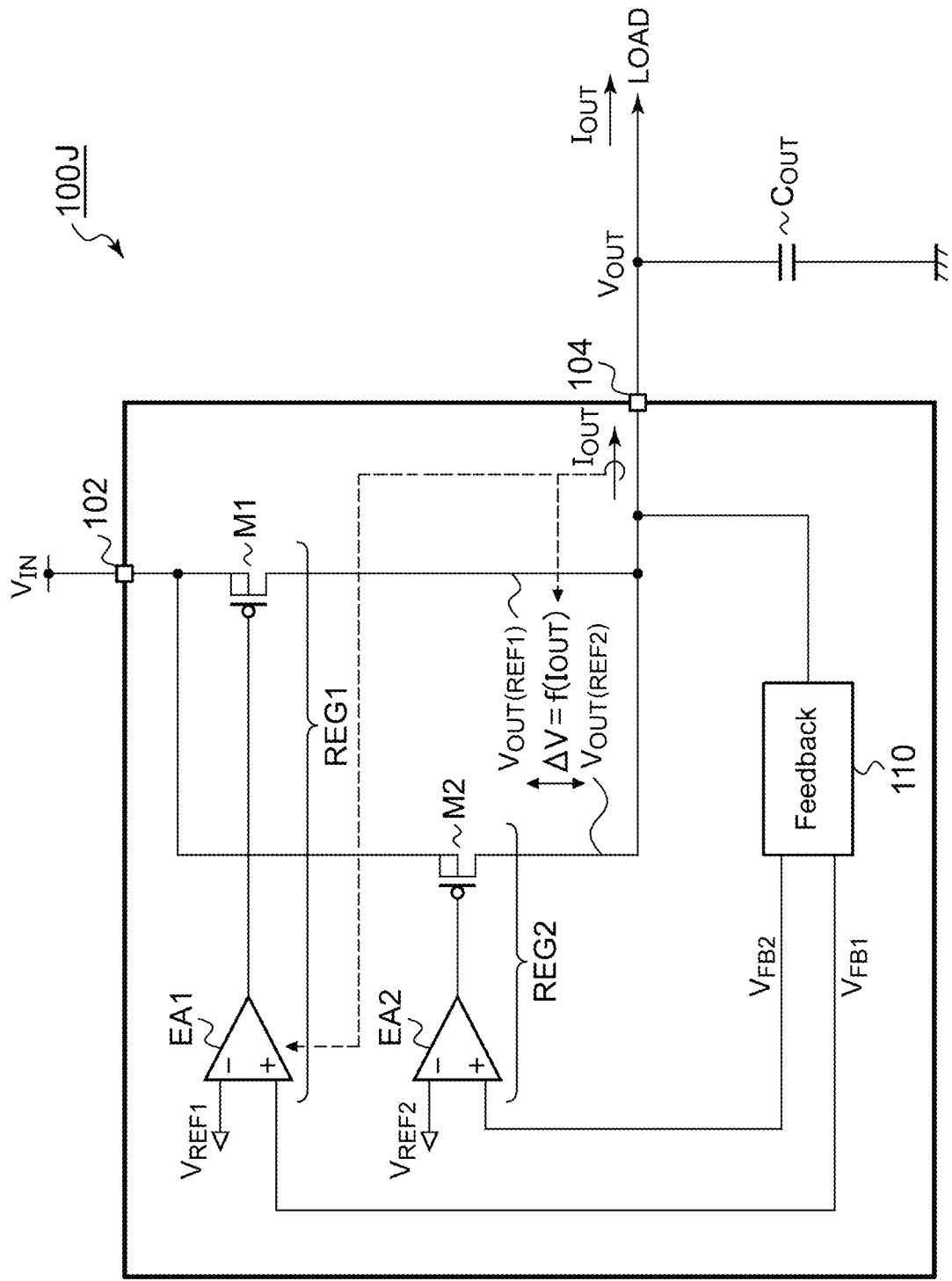
FIG. 30 is a circuit diagram showing a regulator circuit according to a fifth embodiment.

FIG. 30 is a circuit diagram showing a regulator circuit 100J according to a fifth embodiment. The regulator circuit 100J is configured as a combination of the third embodiment and the fourth embodiment.

Specifically, the difference ΔV between the first target voltage $V_{OUT(REF1)}$ and the second target voltage $V_{OUT(REF2)}$ may be changed according to the load current $I_{OUT}$. Furthermore, in the minimum-load state, the first error amplifier EA1 is substantially turned off.

Figure 31:
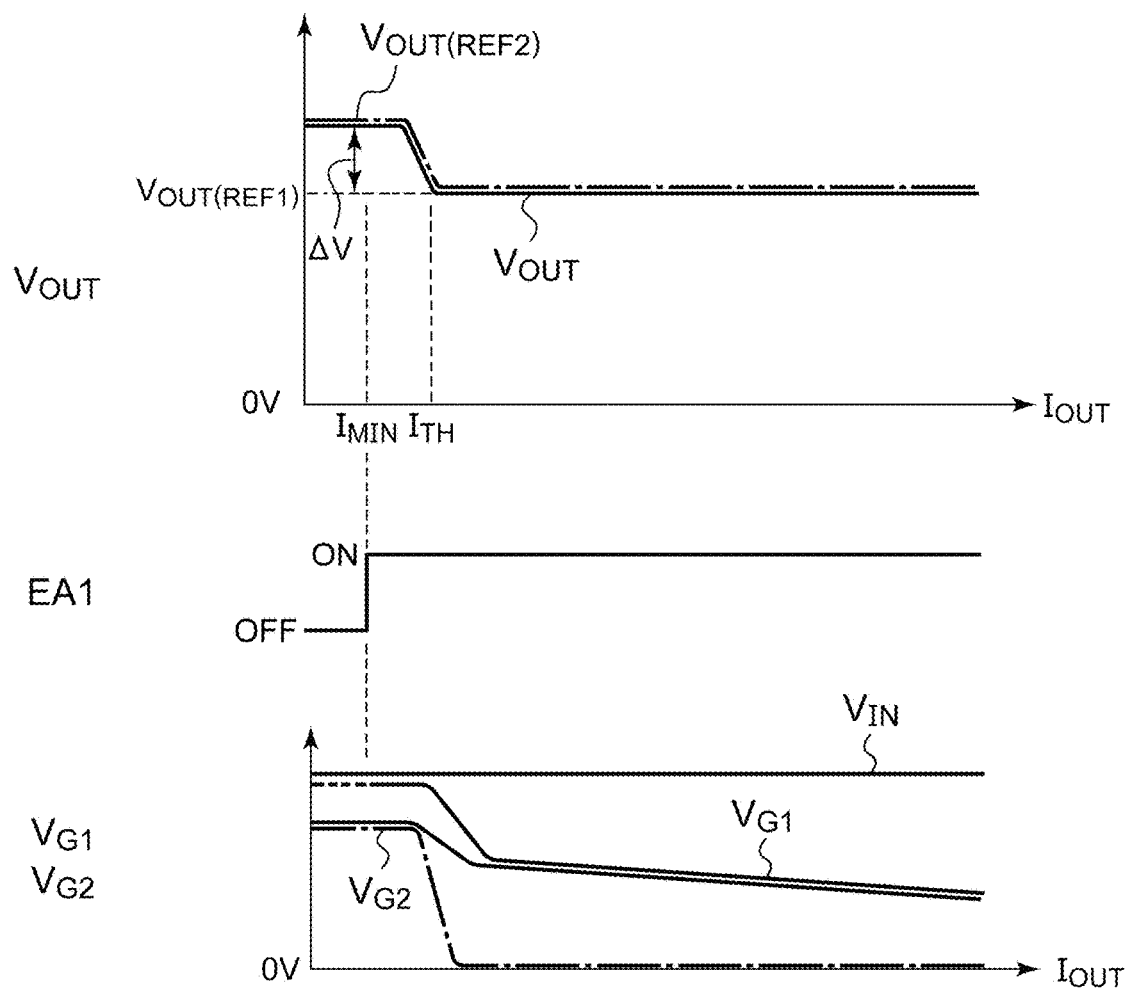
FIG. 31 is a diagram for explaining the operation of the regulator circuit shown in FIG. 30.

FIG. 31 is a diagram for explaining the operation of the regulator circuit 100J shown in FIG. 30. With the fifth embodiment, such an arrangement provides the advantages according to both the third embodiment and the fourth embodiment.

It should be noted that, in the fifth embodiment, in order to change the voltage difference ΔV between the two target voltages $V_{OUT(REF1)}$ and $V_{OUT(REF2)}$, the same mechanism as that described in the third embodiment is employed. Accordingly, description thereof will be omitted. Furthermore, in order to control the first error amplifier EA1, the same mechanism as that described in the fourth embodiment is employed. Accordingly, description thereof will be omitted.

Description has been made above regarding an embodiment of the present invention with reference to the first embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Modification 1

At least one from among the first transistor M1 and the second transistor M2 may be configured as an N-channel MOSFET or an NPN bipolar transistor. In this case, the error amplifier may preferably be arranged such that its inverting input terminal and its non-inverting input terminal are mutually exchanged.

Modification 2

Description has been made in the several examples regarding an arrangement in which the regulator circuit 100 is provided with the monitoring circuit 150. However, the present invention is not restricted to such an arrangement. For example, in a case in which the information with respect to the load current $I_{OUT}$ can be acquired by means of an external microcomputer, the difference ΔV between the target voltages may be controlled based on the information thus acquired.

Modification 3

Description has been made in the several examples regarding an arrangement in which the current that flows through the light-load-supporting regulator REG2 is detected in order to monitor the light-load state. However, the present invention is not restricted to such an arrangement. Also, both the current that flows through the heavy-load-supporting regulator REG1 and the current that flows through the light-load-supporting regulator REG2 may be monitored. Also, the current that flows through a line that couples the output terminal 104 and the common drain of the first transistor M1 and the second transistor M2 may be monitored. Also, the output current of the regulator circuit 100 has a correlation with the input current. Accordingly, the load state may be monitored based on the input current of the regulator circuit 100.

While the preferred embodiments of the present invention have been described using specific terms, such description is for illustrative purposes only, and it is to be understood that changes and variations may be made without departing from the spirit or scope of the appended claims.

What is claimed is:

1. A regulator circuit structured to supply an output voltage to a load, the regulator circuit comprising:
a first linear regulator; and
a second linear regulator having a smaller current capacity than that of the first linear regulator and having its input and its output respectively coupled to an input and an output of the first linear regulator,
wherein a difference between a target voltage of the first linear regulator and a target voltage of the second linear regulator is changed according to a state of the load,
wherein the first linear regulator comprises:
a first transistor; and
a first error amplifier structured to control the first transistor such that a first feedback signal $V_{FB1}$ that corresponds to the output voltage approaches a first reference value $V_{REF1}$,
and wherein the second linear regulator comprises:
a second transistor arranged in parallel with the first transistor, and structured to have a relatively small size; and
a second error amplifier structured to control the second transistor such that a second feedback signal $V_{FB2}$ that corresponds to the output voltage approaches a second reference value $V_{REF2}$,
wherein the regulator circuit further comprises an offset control unit structured to change either a difference between the first reference value $V_{REF1}$ and the second reference value $V_{REF2}$ or a difference between the first feedback signal $V_{FB1}$ and the second feedback signal $V_{FB2}$ according to a load current.

2. The regulator circuit according to claim 1, wherein, in a light-load state, the target voltage of the second linear regulator is higher than the target voltage of the first linear regulator,
and wherein, in a heavy-load state, the target voltage of the second linear regulator is adjusted such that it approaches the target voltage of the first linear regulator.

3. The regulator circuit according to claim 2, wherein the target voltage of the second linear regulator is continuously changed according to a load current.

4. The regulator circuit according to claim 2, wherein the target voltage of the second linear regulator is changed in a discrete manner according to a load current.

5. The regulator circuit according to claim 1, wherein $V_{FB1}=V_{FB2}$ holds true.

6. The regulator circuit according to claim 1, wherein $V_{REF1}=V_{REF2}$ holds true.

7. The regulator circuit according to claim 1, wherein $V_{REF1}<V_{REF2}$ holds true.

8. The regulator circuit according to claim 1, wherein $V_{FB1} > V_{FB2}$ holds true.

9. The regulator circuit according to claim 1, monolithically integrated on a single semiconductor substrate.

* * * * *